US006658172B1

(12) United States Patent
Scobey et al.

(10) Patent No.: US 6,658,172 B1
(45) Date of Patent: Dec. 2, 2003

(54) OPTICAL SYSTEM WITH 1×N INTERLEAVER AND METHODS OF MAKING AND USING SAME

(75) Inventors: Michael A. Scobey, Santa Rosa, CA (US); Lucien P. Ghislain, San Rafael, CA (US); Dennis J. Derickson, Windsor, CA (US); Loren F. Stokes, Santa Rosa, CA (US)

(73) Assignee: Cierra Photonics, Inc., Santa Rosa, CA (US)

( * ) Notice: Subject to any disclaimer, the term of this patent is extended or adjusted under 35 U.S.C. 154(b) by 12 days.

(21) Appl. No.: 10/096,389

(22) Filed: Mar. 12, 2002

Related U.S. Application Data

(60) Provisional application No. 60/275,939, filed on Mar. 15, 2001, provisional application No. 60/275,918, filed on Mar. 15, 2001, provisional application No. 60/276,018, filed on Mar. 15, 2001, provisional application No. 60/275,920, filed on Mar. 15, 2001, provisional application No. 60/275,998, filed on Mar. 15, 2001, provisional application No. 60/276,017, filed on Mar. 15, 2001, provisional application No. 60/275,997, filed on Mar. 15, 2001, provisional application No. 60/276,019, filed on Mar. 15, 2001, provisional application No. 60/276,020, filed on Mar. 15, 2001, provisional application No. 60/276,023, filed on Mar. 15, 2001, provisional application No. 60/275,945, filed on Mar. 15, 2001, provisional application No. 60/276,316, filed on Mar. 16, 2001, and provisional application No. 60/276,022, filed on Mar. 15, 2001.

(51) Int. Cl.[7] .................. G02B 6/26; G02B 6/42; H04J 14/02; H04J 14/00

(52) U.S. Cl. .............. 385/15; 385/39; 385/27; 359/127; 359/124; 398/48; 398/79

(58) Field of Search ............. 385/15, 27, 39; 359/124, 127; 398/48, 79

(56) References Cited

U.S. PATENT DOCUMENTS

| 6,567,430 | B1 | * | 5/2003 | Islam et al. ............. 372/3 |
| 2002/0003643 | A1 | * | 1/2002 | Qian et al. ............. 359/127 |
| 2002/0126291 | A1 | * | 9/2002 | Qian et al. ............. 356/450 |

* cited by examiner

Primary Examiner—Brian Healy
Assistant Examiner—Tina M Lin
(74) Attorney, Agent, or Firm—Banner & Witcoff, LTD

(57) ABSTRACT

An optical system and method are disclosed for multiplexing or de-multiplexing channels within a wavelength band. The optical signals carried on the system comprise separate channels 1 through n, each having a unique passband and a center wavelength spaced from the center wavelength of adjacent channels by d nm. The signals are semi-multiplexed, demultiplexed, or semi-demultiplexed by an interleaver comprising optically matched and directly optically coupled etalons. Periodic spectral passbands of width less than d nm, spaced from each other a distance of zd, where z is an integer greater than or equal to 3, are substantially transmitted through the interleaver. At least one of the etalons is a bulk optic etalon and comprises first and second selectively transparent thin film mirror coatings on opposite surfaces of a bulk optic that defines the cavity spacing of that etalon.

45 Claims, 20 Drawing Sheets

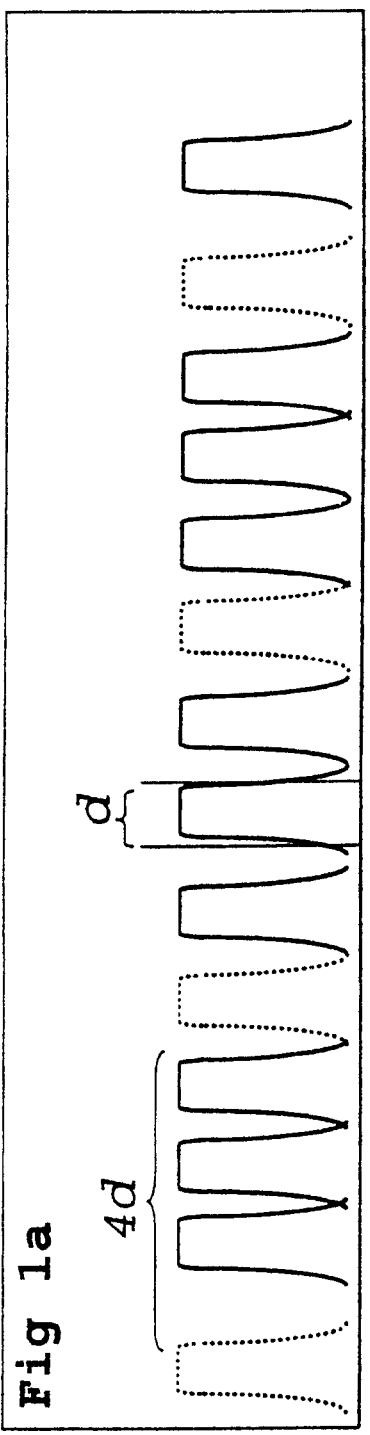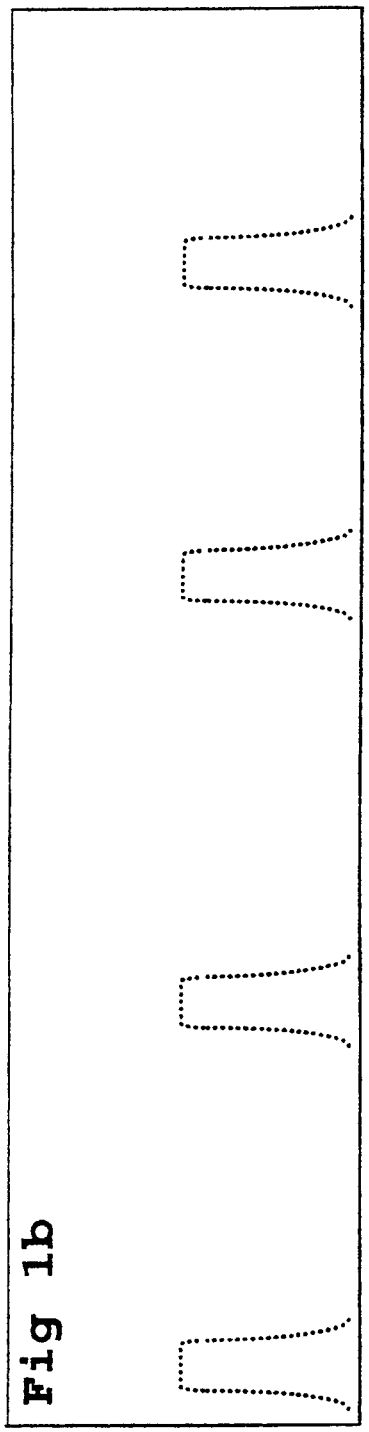

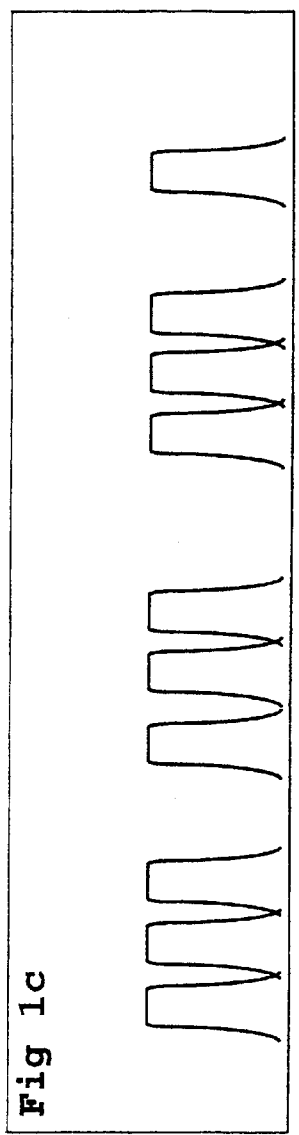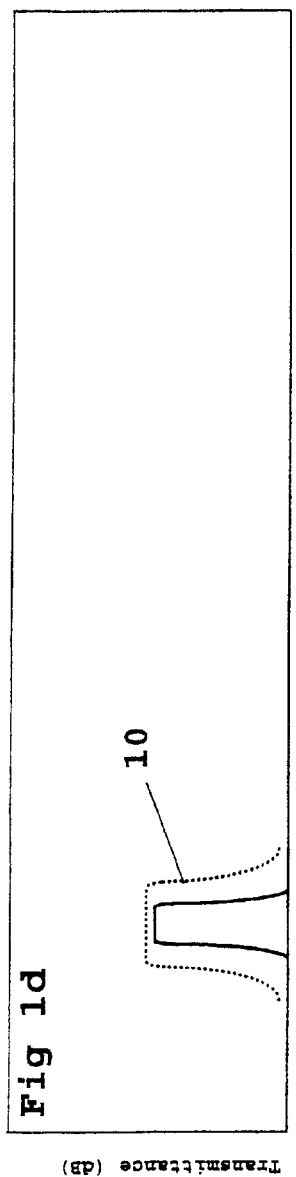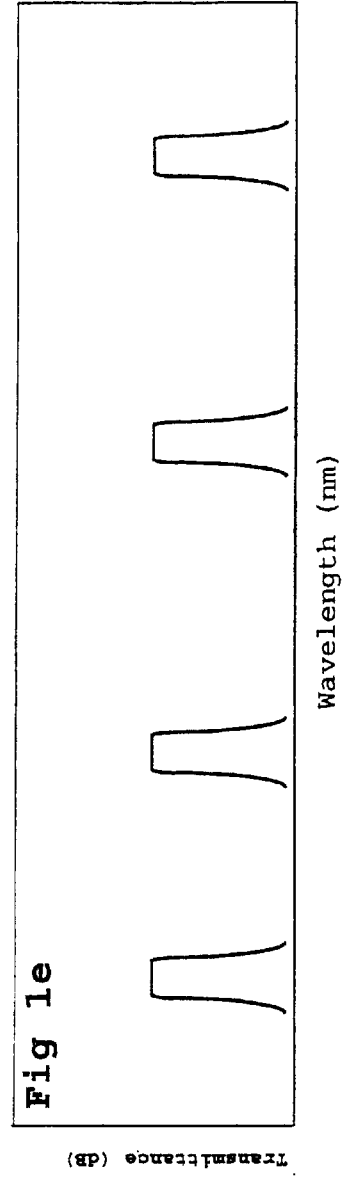

OPTICAL SYSTEM WITH 1×N INTERLEAVER AND METHODS OF MAKING AND USING SAME

PRIORITY APPLICATION

This application claims the priority benefit of U.S. Provisional Application No. 60/276,022 filed on Mar. 15, 2001 and titled "Optical System with 1×N Interleaver and Methods of Making and Using Same."

CROSS-REFERENCED APPLICATIONS

This application is related to commonly assigned U.S. Provisional Application No. 60/275,939 filed on Mar. 15, 2001 and titled "Apparatus and Method for Vacuum Coating Deposition," U.S. Provisional Application No. 60/275,918 filed on Mar. 15, 2001 and titled "Optical System With Cascaded Interleavers and Methods of Making and Using Same," U.S. Provisional Application No. 60/276,018 filed on Mar. 15, 2001 and titled "Optically Coupled Etalons and Methods of Making and Using Same," U.S. Provisional Application No. 60/275,920 filed Mar. 15, 2001 and titled "Iso-Optical Thermal Compensator and Methods of Making and Using Same," U.S. Provisional Application No. 60/275,998 filed on Mar. 15, 2001 and titled "Methods of Making Optical Etalons," U.S. Provisional Application No. 60/276,017 filed on Mar. 15, 2001 and titled "Optical System With Interleaver and Methods of Making and Using Same," U.S. Provisional Application No. 60/275,997 filed on Mar. 15, 2001 and titled "Optical Filter Elements and Methods of Making and Using Same," U.S. Provisional Application No. 60/276,019 filed on Mar. 15, 2001 and titled "Optical Etalons and Methods of Making and Using Them," U.S. Provisional Application No. 60/276,020 filed on Mar. 15, 2001 and titled "Wafer Scale Production of Optical Elements," U.S. Provisional Application No. 60/276,023 filed on Mar. 15, 2001 and titled "Air Space Variable Optical Etalons and Methods of Making and Using Same," U.S. Provisional Application No. 60/275,945 filed on Mar. 15, 2001 and titled "Air Space Optical Etalons and Methods of Making and Using Same," and U.S. Provisional Application No. 60/276,316 filed on Mar. 16, 2001 and titled "Optical Monitoring of Thin Film Deposition Thickness," the entire disclosures of which are hereby incorporated herein by reference for all purposes.

INTRODUCTION

This invention relates to improved optical communication systems incorporating certain optical interleavers for de-multiplexing or multiplexing closely spaced optical channels carried by the system. This invention also relates to methods of making and using such optical systems.

BACKGROUND

There is a growing demand for increasing capacity—or bandwidth—of optical communications systems, including WAN and LAN systems. The internet has greatly increased the amount of information transmitted over optical lines used in telecommunication systems. The use of other systems, such as microwave links, coaxial cables, and copper wires is not as desirable because propagation loss can be higher and channel capacity lower, and they are susceptible to electro-magnetic interference (EMI). Optical systems have the capacity to carry optical information at rates of several megabytes per second to tens of gigabytes per second and higher. Optical system designers and operators have used higher transmission rates to push information faster along optical fibers, and have used multiplexing, including dense wavelength division multiplexing (DWDM), to increase the number of channels carried by a single optical waveguide or signal carrier. In this way, optical systems are more efficiently used. At a receiver end, channels of different wavelengths are generally separated by narrow band filters and then detected or further processed. Optical systems have been designed, for example, to divide the C-band (approximately 1,530–1,565 nm) into 40 channels with 100 GHz spacings, or even 80 channels at 50 GHz spacings. New technology and components are needed to further increase and manage bandwidth in existing and future optical systems. Interleavers are used in some systems designed to employ dense channel spacings An interleaver, or de-interleaver used in the opposite direction, can function essentially as (or as part of) an optical router or switch or add/drop or the like, to permit a system with individual channel passband filters designed for wider channel spacing to effectively isolate individual channels having narrower channel spacings. A system with individual channel passband filters designed to operate at 100 GHz spacings, for example, can be operated at 50 GHz spacings, thereby doubling the channel count. The interleaver combines (or in the case of the de-interleaver, separates) two sets of complementary (i.e., non-overlapping) channels into a more densely packed set of channels. Stated in another way, the interleaver is capable of either multiplexing or de-multiplexing optical signals. That is, the wavelength spectrum carried by an optical system typically is divided into multiple individual channels, each capable of carrying a signal substantially of any signal carried by the other channels carried by the system. Typically, each channel is assigned or pre-allocated a narrow passband straddling a center wavelength, with substantially uniform spacing form the center wavelength of one channel to the center wavelength of the adjacent channel(s). Multiplexing and de-multiplexing the individual channels can be performed with selectively transparent filters designed to reflect all channels except the one channel to be added or dropped. Suitable passband filters are known to those skilled in the art, such as a Fabry-Perot filter comprising a single or preferably multi-cavity thin film coating deposited, e.g. by sputtering, on a surface of a suitable "bulk optic" i.e., a silica glass or other optically transparent substrate. As channel spacings decrease, that is, as wavelength spacing between the assigned center wavelengths of adjacent channels decrease, the difficulty and cost of producing suitable passband filters increases. Thus, while desirable increase in system capacity is achieved at higher channel counts (i.e., at closer channel spacings), there is an undesirable cost increase associated with the correspondingly more narrow passband filters. Accordingly, there is a substantial need for avoiding or reducing such passband filter cost increase.

It has been suggested to use interleavers to partially multiplex or de-multiplex channels in an optical system that employs wavelength division multiplexing. Alternating channels of a multiplexed signal, e.g., a first, third, fifth, etc. channel, are passed by the interleaver as a semi-multiplexed signal (or semi-demultiplexed signal), depending on the direction of operation), while the second, forth, sixth, etc., channels are not passed, but rather reflected back by the interleaver. In current optical telecommunications systems and other demanding optical system applications, it is now found that interleavers having improved optical performance characteristics are needed, including low insertion loss, improved passband shape, etc. Interleavers employing multi-cavity Fabry-Perot thin film coatings, as opposed to single cavity interleavers, are found to provide higher levels of optical performance. Multi-etalon interleavers, i.e., two-cavity and preferably three or higher cavity designs are believed to be necessary to provide optical performance quality and characteristics needed for many optical systems.

It has long been a recognized problem in this industry, that producing interleavers having good optical performance characteristics can be difficult and expensive. In addition, there are industry-recognized problems associated with producing structurally robust interleavers comprising etalons having desired, precise optical properties. Prior known interleavers have employed etalons of various designs, such as the etalons used in the interferometric optical devices of U.S. Pat. No. 6,125,220 to Copner et al. In the interleaver/de-interleaver devices of Copner et al, two glass interferometric end plates are separated by a spacer region where the etalon is formed. The spacer region is an air gap having a predetermined dimension. In adjustable Fabry-Perot devices, such as those disclosed in U.S. Pat. No. 5,283,845 to Ip, tuning of the center wavelength of the spectral passband of an etalon is achieved by varying the effective cavity length (spacing) between two end plates carrying thin film reflectors. More specifically, in Ip a piezo actuator is used, extending between the two end plates. By varying the electric power applied to the piezo actuator, the axial length of the actuator can be varied, and thus the gap between the end plates varied. As alternatives to piezo-electric actuators, the tuning mechanism may employ liquid crystals, temperature, pressure, and other mechanisms. In U.S. Pat. No. 6,040,932 to Duck et al, a system and method are discussed for de-multiplexing closely spaced optical channels separated from one another by a distance "d". A periodic multi-cavity Fabry-Perot etalon having a free spectral range of "2d" (or an integer multiple of 2d) is coupled to a circulator for launching an input beam. A first composite optical signal carrying channels 1, 3, . . . n is reflected from the input port of the etalon and a second composite optical signal carrying channels 2, 4, . . . n-1 is transmitted through the etalon. Duck et al do not disclose how a suitable multi-cavity etalon could be constructed. Only the adjustable gap etalon of the Ip patent is cited, with no suggestion as to how multiple such adjustable etalons could be optically coupled. The piezo actuators and associated hardware would seemingly prevent optical contact of adjacent etalons. It is also a disadvantage that adjustable etalons as in Ip involve considerable assembly complexity and cost. Also, maintaining strict parallelism between the end plates can present additional difficulties.

It is an object of the present invention to provide a system for separating closely spaced channels in a wavelength band and to methods of making and using them. Additional objects and aspects of the invention and/or of certain preferred embodiments of the invention will be apparent from the following disclosure and detailed description.

SUMMARY

This invention, in accordance with a first aspect, relates to a method and system for semi-multiplexing or semi-demultiplexing channels in a wavelength division multiplexed (WDM) signal. In certain preferred embodiments, WDM signals are further processed to fully multiplex or demultiplex the signal. It should be understood, that any use of the term multiplex or semi-multiplex in reference to an optical system disclosed here which is operative in both directions of operation, i. e., the multiplexing and the demultiplexing direction, is intended to mean both and either of these operations. As further discussed below, the optical systems disclosed here are especially advantageous for use with closely spaced WDM channels. An optical system in accordance with this aspect is operative in a wavelength band spanning a series of passbands each having a center wavelength spaced d nm from the center wavelength of adjacent passbands within the wavelength band. The system comprises a signal carrier, e.g., a fiberoptic waveguide or the like, capable of carrying the multiple passbands as individual channels in a WDM multiplexed signal. An interleaver is optically coupled to the signal carrier and comprises a plurality of optically matched and directly optically coupled etalons, having a periodic passband within the wavelength band of the system. More specifically, the interleaver has passbands of width less than d nm and a period equal to zd nm, wherein z is an integer value of at least 3. It will be understood by those skilled in the art, that the necessary degree of precision in the passband width and period of the interleaver will depend in large part on the performance requirements of the optical system. At least one of the optically coupled etalons of the interleaver comprises first and second selectively transparent thin film mirror coatings on opposite first and second surfaces, respectively, of a bulk optic. The bulk optic comprises a solid, optically transparent body, and the dimension of the light path through the bulk optic defines the cavity spacing of the etalon. Typically, the bulk optic comprises a diced portion of an optical substrate, such as a silica wafer known for use in sputtering methods for making passband filters and the like. In preferred embodiments the selectively transparent surfaces are thin film mirror coatings comprising, for example, a film stack of alternating high and low refractive index oxides or a metal thin film in accordance with known thin film technologies. The interleaver preferably is operative in the optical system to pass a first set of the individual channel passbands satisfying the equation 1+xz, wherein z is an integer value of at least 3 and x is an integer value of 0 or greater, as a semi-multiplexed signal and to reject a second set of the passbands not meeting the terms of the equation descried above. The individual channels can be isolated from the semi-demultiplexed signal by further processing such signal using, for example, a set of individual channel passband filters in accordance with known techniques. Advantageously, as disclosed above, the individual passband filters are presented with a semi-demultiplexed signal containing the desired individual channel signals, and from which the passband(s) immediately adjacent to such desired passbands have been removed by the interleaver. For this reason, an individual passband filter will be suitable and operative in the optical system, even if its passband is larger (i.e., twice the wavelength span) of the corresponding channel. As noted above, channel filters having wider passband can be less expensive to produce. The resulting system cost reduction can exceed the cost of the added interleaver. Thus, overall system cost saving can be achieved. In accordance with certain preferred embodiments, the optical system further comprises a set of passband filters mounted in a common housing with the interleaver and optically coupled to the interleaver to receive at least a portion of the semi-demultiplexed signal from an output port of the interleaver In accordance with one aspect, an optical system operative in a wavelength band divided into multiple channels comprises a series of interleavers connected input port to input port. For example, an optical system employing a series of 1×3 interleavers may employ 2 interleavers or 3 interleavers depending on whether or not the final semi-demultiplexed signal is to be passed through an interleaver to clean it. Similarly, an optical system employing 1×4 interleavers may employ 3 or 4 interleavers. Further, a series of interleavers each having an input port and an output port and each operative to pass a different subset of passbands within the wavelength range received via the input port, the subset of passbands of each of the interleavers being different from the subset of passbands of the other of the interleavers, and each directly coupled to an interleaver, and each interleaver comprising a plurality of optically matched and directly optically coupled etalons, at least one of the etalons being a bulk optic etalon comprising first and second selectively transparent thin film mirror coatings on opposite surfaces of a bulk optic defining the cavity spacing of the etalon, the width of the passbands of the interleaver being substantially equal to the passband width of the channels 1 through n and the period of the interleaver being zd nm, where z is an integer value of at least 3. Interleavers, of the type described here, are capable of "interleaving" channels of an optical signal. "Interleaved" for the purposes of this application is to comprising passbands of a first set following those passbands of another set in a generally alternating pattern, but not necessarily being immediately adjacent each other in the wavelength band and not necessarily being of the same width. A semi-demultiplexed signal according to the optical system disclosed here may comprise adjacent channels which will be further demultiplexed by other interleavers in a series of interleavers. It should be recognized that while each of the interleavers in a series of interleavers employed in a preferred embodiment of the operating system disclosed here, typically will have passbands of the same bandwidth and same period for a typical operating system employing a series of 1×3 interleavers, the interleavers will each pass its own unique set of passbands, i.e., a different set of channels.

In accordance with one aspect, an optical system operative in a wavelength band divided into multiple channels comprises at least one signal carrier capable of carrying channels 1 through n. Each channel of the signal has an allocated passband portion of the wavelength band with a center wavelength spaced d nm from the center wavelength of adjacent channels within the band. The optical system also comprises at least one interleaver coupled to the signal carrier and comprising a plurality of optically matched and directly optically coupled etalons. The interleaver has a periodic passband of width d nm and a period equal to zd nm, wherein z is an integer value of at least 3. Further, at least one of the optically matched and directly optically coupled etalons of the interleaver comprises first and second selectively transparent thin film mirror coatings on opposite surfaces of a cavity formed by a bulk optic comprising a solid optically transparent body. The bulk optic defines the cavity spacing of the etalon. The interleaver formed from the etalons has an input port for receiving multiplexed signals. (As described earlier, the interleavers disclosed here typically are capable in an optical system of either multiplexing or de-multiplexing optical signals. reference to either in such cases is intended to include both multiplexing and de-multiplexing.) In accordance with certain preferred embodiments the optical system is operative in the C band, generally understood to be from about 1530 nm to about 1570 nm. According to certain preferred embodiments, the etalons forming the interleaver may further comprise a bonding layer. A bonding layer is any layer of bonding material on a surface of an etalon and used to physically attach that etalon to an adjacent etalon.

The etalons of the interleavers disclosed above are directly optically coupled, as the term is used here, when they are optically coupled, i.e., are in the same optical path, and furthermore are in optical contact or are otherwise in physical contact with each other and/or mounted to each other (e.g., by bonding material in or out of the optical path) or mounted together in the same housing or by the some fixture. An air space may be separating the etalons (or etalon stacks) or the etalons may be in direct surface-to-surface contact. Similarly, optical components of an optical filter element of the systems disclosed here, that are directly optically coupled in accordance with the present disclosure, have no intervening optical component(s) performing substantial channel filtering or like optical operations on the passed signal. In particular, any signal passed by the first optical component of the optical filter element arrives at the second optical component of the optical filter element without any intervening wavelength filtering optical operations to add or drop channels or the like.

According to certain preferred embodiments, the bulk-optic etalons may be placed in optical contact with each other, i.e., the thin film coatings of one such etalon is in direct and substantially continuous surface-to-surface contact with the thin film coatings of an adjacent etalon in the stack, or may be placed in contact using one or more bonding layers between adjacent etalons. According to certain preferred embodiments, the signal carrier is selected from the group consisting of optical fiber, waveguides, and air space. Preferably the signal carrier in the system disclosed here is optical fiber.

In accordance with certain preferred embodiments, the optical system comprises light sources operative to generate signals in some or all of the located channels of the system. Suitable light sources include, for example, single diode emitters and lasers, each preferably emitting light of a specified wavelength or within a wavelength band limited to the allocated passband of a corresponding channel of the optical system. Preferred light sources for optical systems disclosed here include lasers emitting light in the C band. It will be readily apparent to one skilled in the art, given the benefit of this disclosure, which wavelengths and light sources are suitable to meet the optical and other performance requirements of a particular optical system.

In accordance with another aspect, an optical system as disclosed above further comprises second and third interleavers. The second interleaver is optically coupled to the first interleaver, to receive a semi-demultiplexed signal reflected by (i.e., not passed through) the first interleaver. This second interleaver is downstream of the first (again, bearing in mind these systems and components are operable in both directions) and is operative to receive the set of passbands or channels rejected, i.e., not passed, by the first interleaver. This second interleaver is also operative to pass the second channel of the original channel and any channels zd nm from the second of the original channels of the semi-de-multiplexed signal reflected from the first interleaver. All other channels not meeting this requirement are reflected from the second interleaver. The third interleaver is optically coupled to the second interleaver, to receive a semi-demultiplexed signal reflected by (i.e., not passed through) the second interleaver. This third interleaver is downstream of the second (again, bearing in mind these systems and components are operable in both directions) and is operative to receive the set of passbands or channels rejected, i.e., not passed, by the second interleaver. The third interleaver is also operative to pass the third channel of the original signals and any other channels spaced zd nm from the third channel of the original channels of the semi-demultiplexed signal reflected from the second interleaver.

Preferably the three interleavers are housed in a common housing or fixture. As further described elsewhere in this disclosure, the second and third interleavers are especially useful, for example, to further separate the semi-demultiplexed channels rejected from the first interleaver. For example, a first 50 GHz interleaver, that is an interleaver, which has 50 GHz spaced passbands (~0.4 nm), and a 200 GHz period, is operative to reflect 50 GHz width channels that are not spaced zd nm from the first channel. The 50 GHz interleaver of the optical system can be employed to pass a semi-demultiplexed signal comprising the first channel and any channels spaced zd nm form the first channel to a first signal carrier, such as an optical fiber. Such semi-demultiplexed signal can be further processed. Typically, e.g., the passed signal comprising the first channel and channels spaced zd nm form the fist channel can be further demultiplexed into individual channels using a set of 100 GHz passband filters. The 100 GHz individual passband filters are operative to pass the individual 50 GHz passed channels because the reflected 50 GHz channels that were in the original signal have been removed from the original signal. The channels of the reflected signal can then be further separated using a second interleaver, which has 50 GHz passbands operative to reject (i.e., reflect) the 50 GHz width channels that are not spaced zd nm from the second channel. The second 50 GHz interleaver of the optical system can be employed to pass a semi-demultiplexed signal comprising the second channel and any channels spaced zd nm form the second channel to a second signal carrier, such as an optical fiber. Such semi-demultiplexed signal can be further processed. Typically, e.g., the passed signal comprising the second channel and channels spaced zd nm form the second channel can be further demultiplexed into individual channels using a set of 100 GHz passband filters. The 100 GHz individual passband filters are operative to pass the individual 50 GHz passed channels because the reflected 50 GHz channels that were in the original signal have been removed from the semi-demultiplexed signal. The channels of the reflected signal, the second semi-demultiplexed signal, can then be further separated using a third interleaver with 50 GHz passbands operative to reject the 50 GHz width channels that are not spaced zd nm from the third channel. The third 50 GHz interleaver of the optical system can be employed to pass a second semi-demultiplexed signal from the comprising the third channel and any channels spaced zd nm form the third channel to a third signal carrier, such as an optical fiber. Such second semi-demultiplexed signal can be further processed. Typically, e.g., the passed signal comprising the third channel and channels spaced zd nm from the third channel can be further de-multiplexed into individual channels using a set of 100 GHz passband filters. The 100 GHz individual passband filters are operative to pass the individual 50 GHz passed channels because the reflected 50 GHz channels that were in the second semi-demultiplexed signal have been removed from the second semi-demultiplexed signal. The channels of the reflected signal from the third interleaver can then be further separated using individual passband filters.

In accordance with certain preferred embodiments, it may be advantageous to further process the signal after the multi-channel semi-demultiplexed signal is either reflected or passed through the interleaver. Further processing steps may comprise amplification or re-filtering. It may be advantageous to re-filter the signal to remove any remaining levels of the previously filtered signal.

A further advantage of using interleavers in the fashion described above arises from the ability to gracefully expand an optical system. For example, if a system with 25 channels is desired for the first year, with 25 more channels being desired each year for three years, it is more advantageous to install a system that uses every forth channel across the C band than to install 25 channels over a forth of the C band. It is advantageous because amplifiers and other equipment function more efficiently if the entire range of the C band is in use. Additionally, in the beginning phases of installation, less precise individual channel filters can be purchased at a significant cost savings.

In accordance with another aspect, an optical system as disclosed above is operative within a wavelength band and comprises at least one port for launching optical signals from the signal carrier to the interleaver and at least one port for receiving semi-demultiplexed signals passed by the interleaver. In accordance with certain preferred embodiments of such optical systems, there is a first port, that can be referred to as a first signal carrier port, for launching multiplexed signals from the signal carrier to an input port of the interleaver, a second port, preferably a second signal carrier port, an input port to a passband array, a sensor array or detectors or the like, for receiving semi-demultiplexed signals from an output port of the interleaver, specifically, the semi-demultiplexed signals passed by the interleaver, and a third port, again preferably being a signal carrier port, an input port to a passband array, a sensor array or detectors or the like, for receiving semi-demultiplexed signals reflected back from the input port of the interleaver. Where all of the etalons of the interleaver, or at least an etalon at the end of a stack of etalons forming the interleaver, is of the bulk-optic type disclosed above, having first and second selectively transparent thin film mirror coatings on opposite surfaces of a cavity formed by a bulk optic, the input port of the interleaver preferably is one of the aforesaid opposite surfaces of such etalon. The term "bulk optic etalon" is used here to describe the novel optical etalons described here. Likewise, the output port of the interleaver, i.e., the opposite end of the light path through the interleaver, from which semi-demultiplexed signals passed by the interleaver are emitted, preferably is a surface of such a bulk optic etalon in the stack of etalons forming the interleaver. It will apparent to those skilled in the art, however, that the interleavers disclosed here optionally may comprise other thin films or optical elements or devices optically coupled with the stacked etalons and positioned at either end of the light path, such that the input port of the interleaver or the output port may be a surface of any of these. Thus, the first interleaver of the optical system in accordance with this aspect will pass the signal containing a set of channels that meet the equation $1 \times xz$, wherein z is one of the values 3, 4, 5 . . . , x is one of the values 0, 1, 2, . . . (e.g. an integer value of at least 0 or greater than or equal to 0). The other semi-demultiplexed signal, i.e., the reflected signal from its input port, the signal comprises all other channels that do not meet the terms of the equation for the passed channels. As used herein, semi-demultiplexed signals comprise more than one channel, or at least the passbands corresponding to multiple channels of the optical system. At any given point in time, one or more of the channels may not be carrying data or other active signal, but the interleaver nevertheless is operative to pass that channel (or reflect it, as the case may be).

In accordance with another preferred embodiment an interleaver is described which passes a second set of signals from the second of the opposite surfaces which satisfies the equation $1 \times xz$, wherein z is one of the values 3, 4, 5 . . . , x is one of the values 0, 1, 2, . . . The channels of the second set, reflected from the first of the opposite surfaces are all remaining channels not satisfying the above equation. Each channel in the signal from the second of the opposite surfaces must satisfy the equation. For example, a signal which comprises wavelengths $\lambda 1, \lambda 2, \lambda 3, \lambda 4, \lambda 5, \lambda 6, \lambda 7, \lambda 8$, and $\lambda 9$ (corresponding to channels 1, 2, 3, 4, 5, 6, 7, 8, and 9) launched at a 1×4 interleaver, the interleaver will pass channels 1, 5, and 9. Channels 2, 3, 4, 6, 7, and 8 will be reflected from the first of the opposite surfaces. Channel 1 meets the equation and will be passed through the interleaver. In this example z equals 4 because it is a 1×4 interleaver. When x is equal to 0 the equation equals 1, which corresponds to channel 1. Channel 5 meets the equation when x is equal to 2, and channel 9 meets the equation where x is equal to 3.

According to another aspect, the bulk optic of an etalon incorporated into the aforesaid interleaver of the optical system comprises a solid body optically transparent (at the wavelengths of interest) and, together with the transparent body in the bulk optic, a wedge correcting coating (referred to here generally as a "wedge coating") and/or a thickness-adjustment layer on at least one of the two path-of-light surfaces of the optically transparent body. The wedge coating, further described below, establishes high precision parallelism of the surfaces of the etalon carrying the selectively transparent, thin film mirror coatings of the etalon. As disclosed above, the thickness of the bulk optic, i.e., the dimension between the selectively transparent, parallel surfaces, defines the physical dimension of the cavity spacing. The physical thickness of the bulk optic is its dimension in the direction of the light path, i.e., between its coated surfaces on opposite sides of the bulk optic. (The index of refraction of the bulk optic together with the physical dimension establishes the optical path length.) In accordance with this aspect, such thickness includes the transparent body as well as any wedge coating and/or thickness-adjusting layer. Preferably, the bulk optic, including any wedge coating and/or thickness-adjusting layer, has an optical thickness equal to an integral number of half waves for the wavelengths of interest. If a wedge coating is used, the thickness of the wedge coating varies progressively across the etalon. That is, the thickness of the wedge coating, viewed in cross-section in at least one plane orthogonal to the parallel, selectively transparent surfaces of the etalon, has a thickness that increases (or decreases in the opposite direction) continuously, typically approximately linearly, to compensate for non-parallelism, or "wedge", in the underlying body of the bulk optic. The bulk optic can be diced from a wafer on which a wedge coating and the two thin film coatings have been deposited by magnetron sputtering, ion beam sputtering or other known deposition techniques. Preferably, surface polishing is performed to first polish the wafer.

It is a significant advantage that the interleaver of the optical systems disclosed here can employ one or more bulk optic etalons of the type disclosed above, comprising an optically transparent body and optionally a wedge coating and/or thickness adjusting layer to define the cavity spacing of the etalon. Substantial cost savings and production simplification can be realized in accordance with at least certain preferred embodiments of the optical systems employing interleavers comprising stacked, optically matched, directly optically coupled bulk-optic etalons. Further, robust and accurate stacked, optically coupled etalons can be achieved using production techniques whose application will be readily understood by those skilled in the art given the benefit of this disclosure.

In accordance with another aspect a method of making an optical system for operating within a wavelength band comprises the steps of providing an interleaver as disclosed above, comprising a plurality of optically matched and directly optically coupled etalons, wherein at least one of the etalons comprises first and second selectively transparent thin film mirror coatings on opposite surfaces of a bulk optic defining the cavity spacing of the etalon. The interleaver is optically coupled to a source of WDM signals and is optically coupled to at least two devices to receive signals processed by the interleaver. A first device receives the signals reflected from a first surface of the interleaver. A second device receives signals passed through the interleaver.

In accordance with another aspect, additional cavities or etalons can be deposited or otherwise formed on either surfaces of a bulk optic etalon suitable for use in an interleaver. Specifically, thin film etalons can be formed on the input or output surface of such etalons, by suitable deposition techniques, such as, for example, ion beam sputtering, magnetron sputtering, or other physical vapor deposition technique. More specifically, following deposition of a suitable spacer layer overlaying the thin film stacks on either surface of the bulk optic etalon, a cavity can be deposited by, for example, sputtering a first suitable thin film coating or stack, such as a sequence of alternating H/L/H films, followed by deposition of a cavity film, followed by deposition of a second thin film H/L/H coating or stack which preferably is substantially identical to the first thin film coating. Similarly, one or more such additional thin film etalons can be deposited thereafter employing suitable half-wave spacer layers between, in accordance with thin film principles well known to those skilled in the art. Thus, the advantage of improved optical performance characteristics of a multi-cavity device can be achieved, incorporating a bulk optic etalon of the type disclosed above together with additional thin film etalons unitary therewith by depositing such thin film etalons thereon using sputtering or other suitable deposition techniques. Any suitable materials disclosed above, and other suitable materials known to those skilled in the art, may be used for the thin films of the thin film etalons including but not limited to $Ta_2O_5$, $ZrO_2$, $TiO_2$, $Al_2O_5$, $SiO_2$, and MgF. The multi-cavity deposition product, described above, is suitable for use, generally together with or in place of the single cavity embodiments of the bulk optic etalons disclosed here.

In accordance with certain embodiments, the etalons forming the interleaver in an optical system operative in a wavelength band divided into multiple channels, as described above, are bonded to each other. Each etalon comprises any or all of the components listed above including, but not limited to, a bulk optic, optionally comprising a wedge coating and/or a thickness-adjustment layer, and thin film mirror coatings on the surfaces of the bulk optic. Between adjacent etalons may be a layer of bonding material that acts to optically couple the etalons together. The thickness of the bonding layer is preferably equal to an odd number of QWOTs. This bonding layer may be an adhesive, such as an epoxy, e.g. the epoxies available from Epoxy Technology, Billerica, Mass. such as, EPO-TEK 353 ND, an adhesive optionally having a monolayer of small beads embedded in the adhesive to facilitate precise spacing of the adjacent etalons, fritted glass or any other composition or material that may be deposited to an odd number of QWOTs and is capable of bonding the etalons together.

In accordance with certain preferred embodiments, adjacent etalons forming the interleaver of the optical system operative in a wavelength band divided into multiple channels are joined using a layer of epoxy or other suitable adhesive. The adhesive can be applied using any suitable technique. The adhesive may be deposited onto wafers, coupons, or onto individual etalons. Two or more wafers, two or more coupons, or individual etalons are stacked in physical contact after the adhesive is applied. After being placed in physical contact, the adhesive layer bonds the etalons forming stacked, optically coupled etalons. One skilled in the art will recognize, given the benefit of this disclosure, that this process may be repeated using additional etalons to increase the number of etalons that are coupled and stacked.

Optical systems comprising the interleaver disclosed here offer several advantages including considerable cost savings and precise optical performance characteristics. In addition to incorporation of the interleaver into new optical systems, existing optical systems may be modified, adapted or altered to incorporate the interleaver described here to provide higher signal throughput rates, for example. Those skilled in the art, given the benefit of this disclosure, will be able to incorporate the interleaver and technologies related to and based on the interleaver described here into existing optical systems.

The interleavers of the optical systems disclosed here, and the methods disclosed for their production will be recognized by those skilled in the art to represent a significant technological advance. Robust interleavers can be produced meeting precise optical performance characteristics, with advantageously low production costs and good production flexibility. In preferred embodiments, the interleavers have the advantageous attributes of small size, simple and potentially inexpensive construction, and good optical performance, including low loss, low polarization dependent loss and polarization mode dispersion, and low chromatic dispersion. Additional features and advantages will be understood from the following detailed description of certain preferred embodiments.

Additional advantages and features of the optical systems and components disclosed here will be apparent to those skilled in the art, given the benefit of the foregoing disclosure and the following detailed description of certain preferred embodiments.

BRIEF DESCRIPTION OF THE DRAWINGS

Certain preferred embodiments of the invention will be described below with reference to the attached drawings in which:

FIG. 1a is a schematic of multiplexed light, within a desired operating range, that is semi-demultiplexed shown in FIGS. 1b and 1c, and demultiplexed, shown in FIGS. 1d and 1e;

Figure 2A:
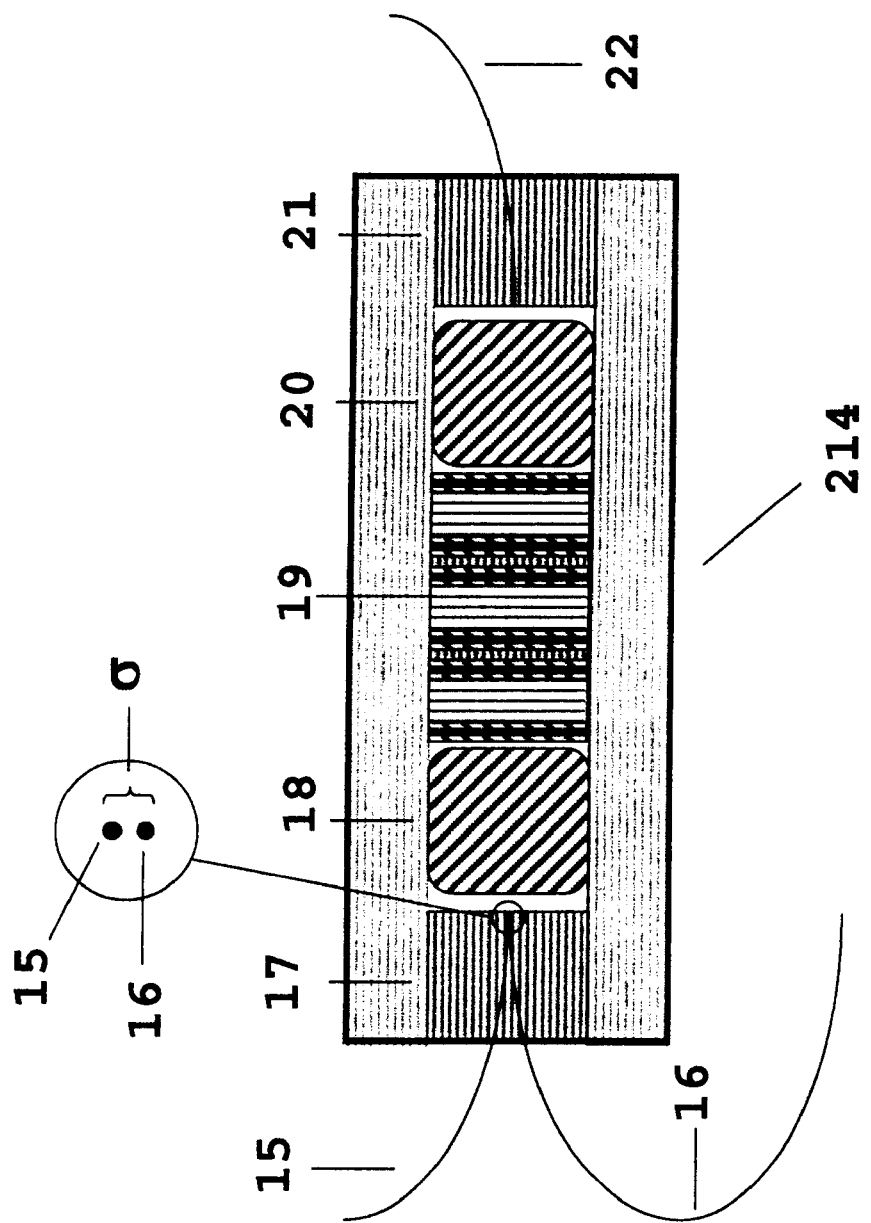
FIGS. 2a and 2b are schematic views of an optical system, comprising dual fibers, operative in a wavelength band according to preferred embodiments.

It will be apparent that the optical system operative in a wavelength band shown in FIGS. 2–16 are not necessarily to scale. Certain dimensions, such as the thickness of thin film coatings, may have been enlarged relative to other dimensions, such as the thickness of the bulk optic, for clarity of illustration and ease of understanding. Directional references used in this disclosure and detailed description, and in the claims, refer to the orientation shown in FIG. 6 unless otherwise clear from context. It will be understood by those skilled in the art, that the devices disclosed here can be used generally in any orientation relative to gravity and/or other components to which they might be optically and/or physically coupled, e.g., by optical fiber or the like.

DETAILED DESCRIPTION OF CERTAIN PREFERRED EMBODIMENTS

It will be recognized from the above, that the optical system operative in a wavelength band disclosed here, can be formed in innumerable different configurations and sizes. The precise size and configuration of the optical system operative in a wavelength band, including the choice of components, materials, design of the thin films coatings used for any of the etalons, cavity spacing and the like will depend in large part on the particular application and use environment for which it is intended and its desired optical properties and performance characteristics. It will be within the ability of those skilled in the art, given the benefit of this disclosure, to select suitable materials and designs, as well as manufacturing techniques, for production of optical components and systems in accordance with the principles of the present invention, suitable for these and other types of applications.

In accordance with one preferred embodiment, the interleaver described here operates functionally to select certain passbands from multiplexed light (see FIGS. 1a–1c). More specifically, passbands that are spaced 4d nm apart are passed by the interleaver and all other passbands are reflected. For example, multiplexed light comprising a plurality of passbands (see FIG. 1a) may be incident on an interleaver. The interleaver is designed and the optical characteristics of the interleaver are such that passbands that are spaced 4d nm apart, where d is the width of the passband (more preferably d is the passband width at half maximum height (PWHM)), may be passed by the interleaver. (see FIG. 1b). All other passbands are reflected. A second interleaver, however, can act to select the passbands that were reflected by the first interleaver (see FIG. 1c). In certain embodiments, a passband filter may be optically coupled to the interleaver to select a single passband. For example, the passbands which are selected by the first interleaver (e.g. a first output signal) may be incident on a first passband filter. A single passband will then be selected using the first passband filter, e.g. the single passband selected is a second output signal (see FIG. 1d). The remaining passbands in the first output signal are reflected and additional passbands may be isolated using additional interleavers, such as the second interleaver used to isolate the passband shown in FIG. 1e. An advantage of using the interleavers described here is that the channel width of the passband filter may be more than the PWHM for a given passband. For example, channel width 10 may be 100 GHz while the PWHM may only be 50 GHz (see FIG. 1d). When used in isolation, however, a passband filter comprising 100 GHz channel width may not separate multiplexed light into a single passband. Therefore, a wider channel width can be used to select passbands comprising low passband widths such as 50 GHz, 25 GHz or lower, for example 10 GHz, when passband filters are used with the interleaver described here.

Certain preferred embodiments of the optical system disclosed here comprise a first signal carrier optically coupled to the bulk optic interleaver. The signal carrier is preferably selected from the group consisting of fiber, waveguide, air space, or other suitable devices. Preferably the signal carrier in the system disclosed here is fiber. One of ordinary skill in the art, given the benefit of this disclosure, will be able to determine suitable signal carriers for an intended application.

As disclosed above, the bulk optic interleaver incorporated into the optical system disclosed here is made from an interleaver comprising multiple etalons wherein at least one of the etalons comprises first and second thin film coatings on parallel opposite sides of a cavity formed by a bulk optic comprising a solid, optically transparent body and, optionally, a wedge coating and/or a thickness adjustment layer on a surface of the optically transparent body. In other preferred embodiments of the optical system, the optical system has a first port for launching a multiplexed signal from a first signal carrier into the interleaver. The launching end of this first signal carrier preferably is fitted with a device to facilitate the launching of the signal into the interleaver at an angle of incidence ≦1 degree. Suitable fittings include, for example, a dual fiber collimator, a single fiber collimator, an optical circulator or the like, a 50/50 splitter used with a single fiber collimator, etc. It will be within the ability of those skilled in the art to employ suitable end fittings to optically launch WDM optical signals into the interleavers or other components of the optical systems disclosed here. In certain embodiments the light is launched from an optical device, such as for example, a laser, collimator, drum lens, ball lens, grin lens, etc. The system may also have additional ports, such as a second port for receiving a semi-demultiplexed signal that is reflected from the first surface of the interleaver, and a third port for receiving the semi-demultiplexed signal that passes through the interleaver. Each additional port is preferably constructed as just described for the first port.

The wedge coating of the etalons forming the interleaver disclosed here overcomes the non-parallelism of bulk optic surfaces. The wedge coating underlies the first thin film coating, and the axial dimension of the bulk optic, i.e., the optical thickness dimension of the bulk optic in the direction of light passage through the etalon, defines the cavity spacing of the etalon. As used here the term "bulk optic" refers to a component of the etalons forming the interleaver disclosed above comprising a solid, optically transparent body, such as a portion of an optically transparent wafer diced into multiple pieces after being coated, together with the wedge coating and/or thickness-adjustment layer. The solid, optically transparent body is an optically transparent substrate having first and second generally flat surfaces on opposite sides, which is self-supporting in the sense that it does not require an underlying support member to retain its shape and integrity during handling, packaging and transport in manners typical for optical elements intended for use as sensors, fiber optic communication system components or the like. Most preferably the transparent body of the bulk optic is a monolithic body, that is, a one-piece, self-supporting and unitary body of material. The transparent body of the bulk optic typically will comprise a portion of an optical transparent wafer. After coating the wafer it is cut or diced into multiple coupons. The coupons may further be cut or diced into multiple etalons. The wedge coating overlies a surface of the transparent body of the bulk optic, and there may or may not be a visible or discernable seam or interface between them. In certain preferred embodiments the wedge coating and thickness adjustment layer are formed of material that is the same as that of the transparent body. In other preferred embodiments, the wedge coating and/or thickness-adjustment layer are formed of a material comprising substantially the same refractive index as the material comprising the optically transparent body, e.g. the refractive indices differ by less than about ±0.01. It may, therefore, be difficult or impossible to see the boundaries between the transparent body and the added wedge coating and thickness-adjustment layer. It is, of course, desirable generally that there be no or substantially no optical effect at such boundaries which would adversely impact the performance of the etalon. Thus, the wedge coating and thickness-adjustment coating may be difficult or even impossible to distinguish from the material of the underlying optically transparent body, at least without observing the manner in which the etalon was produced. This typically will not be the case where different materials are used for the optically transparent body, wedge coating and thickness-adjustment coating. In any event, these components of the bulk optic are distinct from each other in the function they perform and in their position in the bulk optic.

One skilled in the art, given the benefit of this disclosure will be able to select an angle of incidence suitable for an intended application. In certain embodiments the light is launched at a first surface of the interleaver from an optical device or fitting associated with the signal carrier, such as for example, a collimator, ball lens, grin lens, etc. One skilled in the art, given the benefit of this disclosure, will also be able to select suitable optical devices for launching light signals to the interleaver and for receiving semi-demultiplexed signals reflected back from the first surface of the interleaver and for receiving from the second surface of the interleaver semi-demultiplexed signals passed by the interleaver. In certain embodiments employing dual fibers, the signal is incident on a surface of the interleaver at an angle of incidence preferably $\leq 1°$. That is, the multiplexed signal is launched from the optical fiber or other waveguide or signal carrier to the receiving surface of the interleaver, referred to here in some instances as the input port or first port surface of the interleaver, nearly but not quite perpendicular to that surface. The term angle of incidence is used here for its ordinary meaning, i.e., the angle formed by a ray incident on a surface and a perpendicular to the surface at the point of incidence. Referring to FIG. 2a, a dual fiber optical system is shown comprising a fitting, an input fiber or signal carrier 15 carrying multiplexed signals, an output fiber or signal carrier 16, a fitting 17, such as a ferrule, containing the input and output fibers, a first collimator 18, an interleaver 19, for semi-demultiplexing the multiplexed signals, a second collimator 20, and a fitting 21, such as a ferrule, containing an output fiber or signal carrier 22 for carrying an output signal. In certain embodiments, the components of the dual fiber optical system are in optical contact. In other embodiments, the components of the dual fiber optical system are separated by air space. Referring to FIG. 2a, multiplexed signals (e.g. 1,2,3,4,5,6,7,8 . . . ) are launched into the optical system by input fiber 15. The multiplexed signals are incident on the surface of the first collimator 18, and preferably the angle of incidence is $\leq 1°$. The first collimator 18 focuses the multiplexed signals, which are then incident on a first surface of interleaver 19, such as stacked, optically coupled etalons. The interleaver 224 selectively passes certain signals, e.g. passed signals 1,4,7 . . . , and reflects other signals, e.g. reflected signals 2,3,5,6,8 . . . Signals which are passed by the interleaver exit the second surface of the interleaver and enter a second collimator 20 and are transmitted to an output fiber or signal carrier 22 for detection, decoding, etc . . . The signals that are reflected, e.g. the reflected signals, are carried to a detector, decoder, etc. through an output fiber or signal carrier 16. The output fiber 16 is positioned near the input fiber such that the angle of incidence is $\leq 1°$. For example, referring to the inset in FIG. 2a, the terminal portion of output fiber 16 may be positioned a distance a from the originating portion (or terminal portion as the case may be) of input fiber 15. In preferred embodiments, the distance between the fibers σ is less than about 70 microns, more preferably less than 66 microns, to achieve an angle of incidence $\leq 1°$. Numerous modifications to the optical system may be made including replacement of the collimator with a ball lens, grin lens, drum lens, a 50/50 splitter used with a single fiber collimator and the like. One skilled in the art, given the benefit of this disclosure, will be able to assemble and use dual fiber optical systems suitable for semi-demultiplexing multiplexed signals.

Figure 2B:
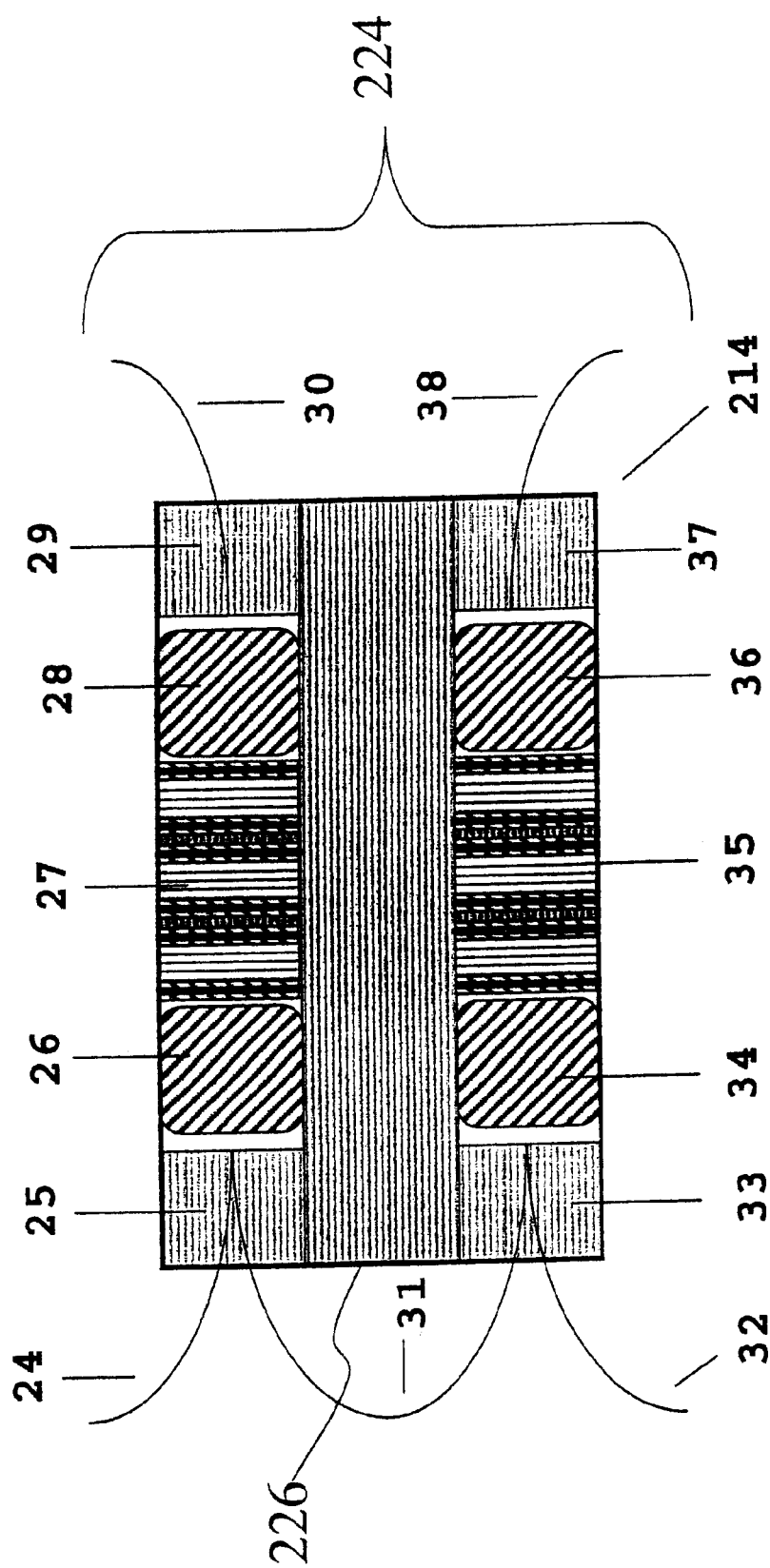

In alternative embodiments of a dual fiber optical systems, such as the embodiment shown in FIG. 2b, the optical system comprises an interleaver 224 comprising multiple interleavers arranged in parallel. The optical system comprises a fitting 214, housing member 226, an input fiber 24, a first output fiber 30, a second output fiber 31, a third output fiber 38, and a fourth output fiber 32. Multiplexed signals are launched into the optical system through input fiber 24. Input fiber 24 and a portion of output fiber 31 are mounted within fitting 25, such as a ferrule. The multiplexed signal is incident on collimator 26, which focuses the multiplexed signal onto a first surface of a first interleaver 27. The first interleaver acts to selectively pass certain signals, e.g. passed signals 1,4,7 . . . , and reflects other signals, e.g. reflected signals 2,3,5,6,8 . . . Signals which are passed by the first interleaver exit the second surface of the first interleaver and enter a second collimator 28 and are transmitted to a first output fiber 30 for detection, decoding, etc . . . The signals which are reflected are carried by second output fiber 31 to second fitting 33, such as a ferrule. The reflected signals are launched onto the first surface of a second collimator 34. The second collimator 34 focuses the signals onto a first surface of the second interleaver 35. In certain embodiments, the interleaver passes the reflected signals, and reflects all other signals, e.g. noise or any residual passed signals. The reflected signals then exit the second surface of the second interleaver and are transmitted through collimator 36 and into third output fiber 38 for detection, decoding, etc. The noise is reflected and enters fourth output fiber 32. In other embodiments, the second interleaver 35 reflects the reflected signals and passes any residual passed signals. The reflected signals are transmitted to the fourth output fiber 32 for detection, decoding, etc. In preferred embodiments, the terminal portions of the output fibers are positioned close to, e.g. less than 66 microns apart, in the fitting, e.g. the ferrule, of the optical system. Such positioning allows the angle of incidence of any reflected signals to be $\leq 1°$.

Figure 3:
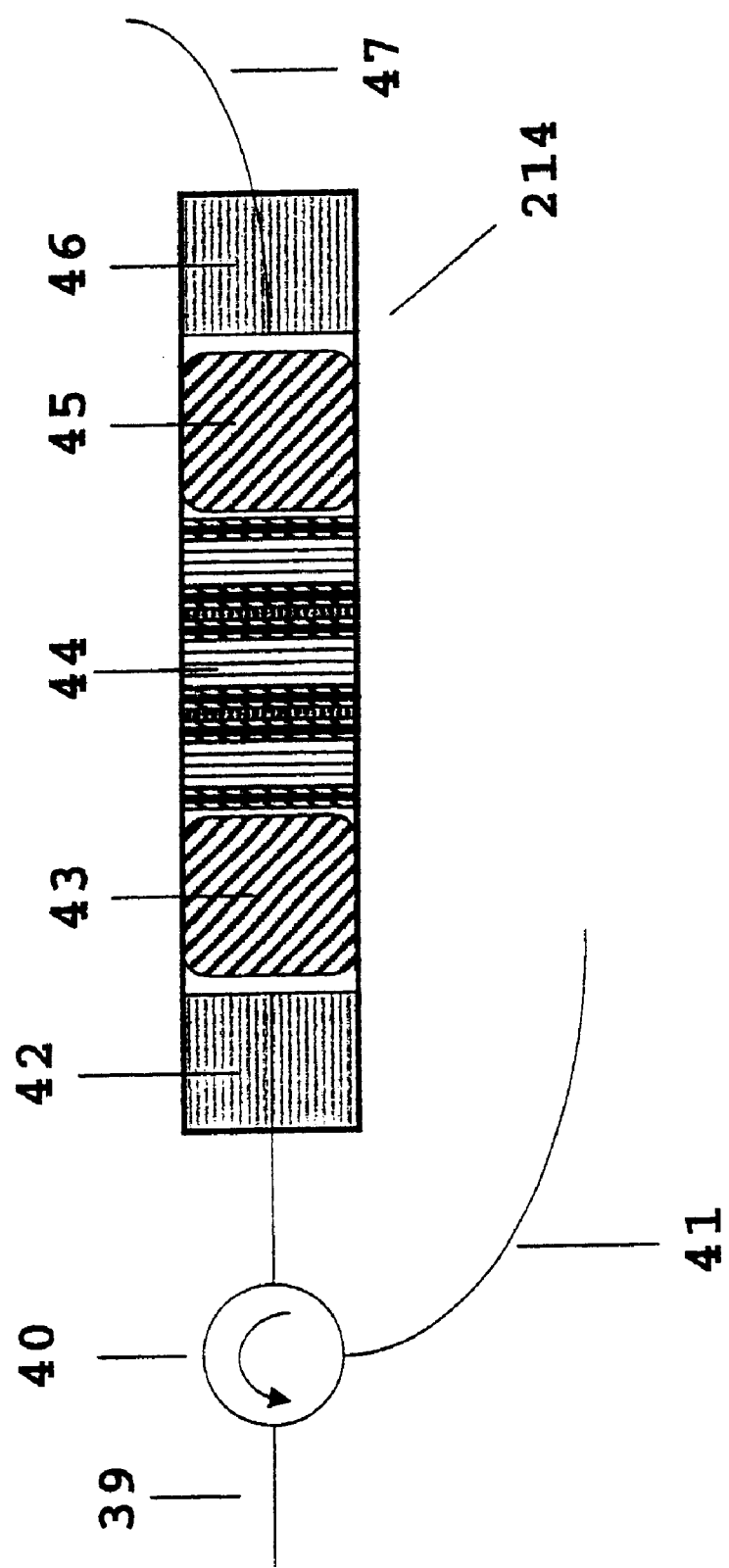
FIG. 3 is a schematic view of an optical system, comprising a single fiber, operative in a wavelength band according to preferred embodiments.

In accordance with preferred embodiments, an optical system may be constructed with a single fiber. Referring, to FIG. 3, a single fiber system comprises a fitting 214, an input/output (I/O) fiber 39, a circulator 40, a fitting 42, such as a ferrule, a first collimator 43, an interleaver 44, a second collimator 45, and an output fiber 47 originating (or terminating as the case may be) in fitting 46, such as a ferrule. In certain embodiments, the components of the single fiber optical system are in optical contact. In other embodiments, the components of the single fiber optical system are separated by air space. Referring to FIG. 3, multiplexed signals (e.g. signals 1,2,3,4,5,6,7,8 . . . ) are launched from I/O fiber 39 onto the surface of first collimator 43. The first collimator focuses the light onto a first surface of the interleaver 44. Preferably the angle of incidence is $\leq 1°$. Certain signals, 1,4,7 . . . , are passed by interleaver 44 and other signals are reflected, 2,3,5,6,8, . . . Signals which are passed by the interleaver exit the second surface of the interleaver and are incident on the surface of a second collimator 45. The second collimator focuses the passed signals into an output fiber 47 for detection, decoding, etc. Signals which are reflected re-enter I/O fiber 39, and circulator 40 directs the even signals to a second output fiber 41 for detection, decoding, etc. Numerous modifications to the optical system may be made including replacement of the collimator with a ball lens, grin lens, drum lens, a 50/50 splitter used with a single fiber collimator and the like. One skilled in the art, given the benefit of this disclosure, will be able to assemble and use single fiber optical systems suitable for semi-demultiplexing multiplexed signals.

In certain embodiments, the signal is incident on a surface of the etalon at an angle of incidence preferably $\leq 1°$. That is, the multiplexed signal is launched from the optical fiber or other waveguide or signal carrier to the receiving surface of the interleaver, referred to here in some instances as the first port surface of the interleaver, nearly but not quite perpendicular to that surface. The term angle of incidence is used here for its ordinary meaning, i.e., the angle formed by a ray incident on a surface and a perpendicular to the surface at the point of incidence. One skilled in the art, given the benefit of this disclosure will be able to select an angle of incidence suitable for an intended application. In certain embodiments the light is launched at the first port surface of the interleaver from an optical device or fitting associated with the signal carrier, such as for example, a collimator, ball lens, grin lens, etc. One skilled in the art, given the benefit of this disclosure, will be able to select suitable optical devices for launching light signals to the interleaver and for receiving semi-demultiplexed signals reflected back from the first port surface of the interleaver and for receiving from the second port surface of the interleaver semi-demultiplexed signals passed by the interleaver.

Figure 4:
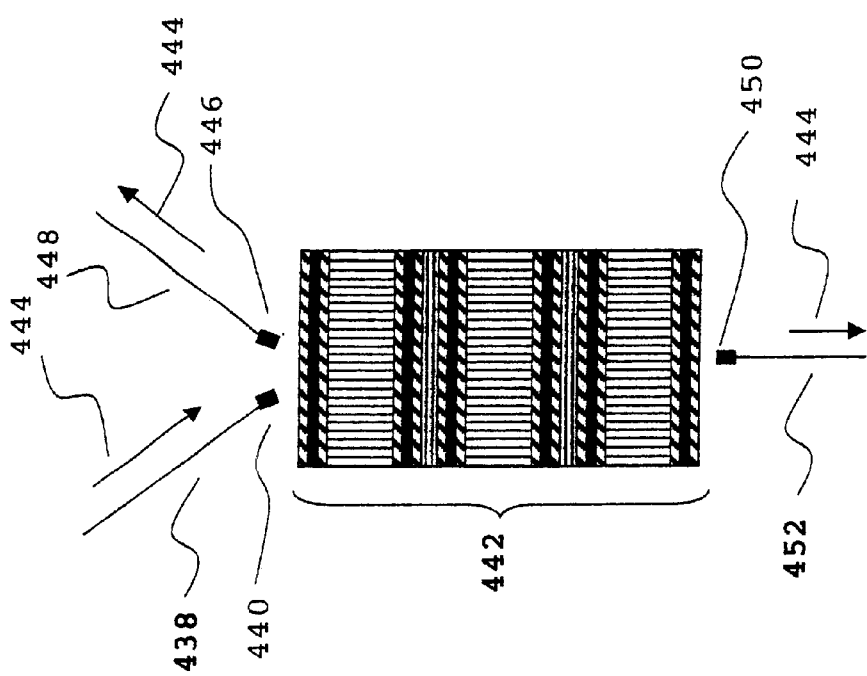
FIG. 4 is a schematic section view of an optical system operative in a wavelength band according to a one preferred embodiment.

Referring now to FIG. 4, at the first end of the optical system is a signal carrier 438 with a receiving end and a launching end. The launching end of the signal carrier 438 is fitted with a collimator 440 for launching the multiplexed signal at the first of the opposite surfaces of the interleaver 442. The flow of signal through the system is denoted by the arrow 444. The interleaver 442 comprises optically matched and optically coupled etalons described more fully in FIG. 5. Signal reflected from the first of the opposite surfaces of the interleaver is received by the collimator 446 coupled to signal carrier 448. The signal passed by the interleaver 442 is received by collimator 450 coupled to signal carrier 452. In accordance with another preferred embodiment, an interleaver is in a system carrying a signal comprising channels 1 through n. Each channel of the signal has a substantially unique passband with a center wavelength spaced d nm from the center wavelength of adjacent channels within the band. The interleaver operates on the wideband optical signal to be filtered, whereby only periodic spectral passbands spaced a distance of 2d from each other are substantially transmitted out of the interleaver. The other signals are reflected from the first of the opposite surfaces of the interleaver. The periodic response of the interleaver allows the separation of alternate channels from a sequence of closely spaced channels into two optical signals for further filtering and processing.

The substrate piece forming the body of the etalons forming the interleaver preferably is one of many diced from a substantially planar substrate, e.g., a glass, indium phosphide, silica or silicon wafer. Other suitable materials and glasses will be apparent to those skilled in the art given the benefit of this disclosure. Dicing can occur after the wafer has received a wedge coating, a thickness-adjustment layer and the thin film coatings by physical vapor deposition, preferably sputter deposition. Thus, in these preferred embodiments the substrate piece forming the body of each etalon in the interleaver is diced from a larger body sufficiently self-supporting as to be suitable for mounting (with and without spinning) in a vacuum deposition chamber for depositing optically functional coatings or film stacks on one or both sides. The bulk optic component of the etalons forming the interleaver disclosed here, in accordance with preferred embodiments, typically is a very small piece of such a wafer. While the wafer often is 4–12 inches in diameter or larger, the coated parallel surfaces of the bulk optic or finished etalon diced from the wafer will generally be in the size range of 0.5 to 5.0 mm across their largest dimension. Thus, numerous etalons can be obtained from each wafer.

Figure 5:
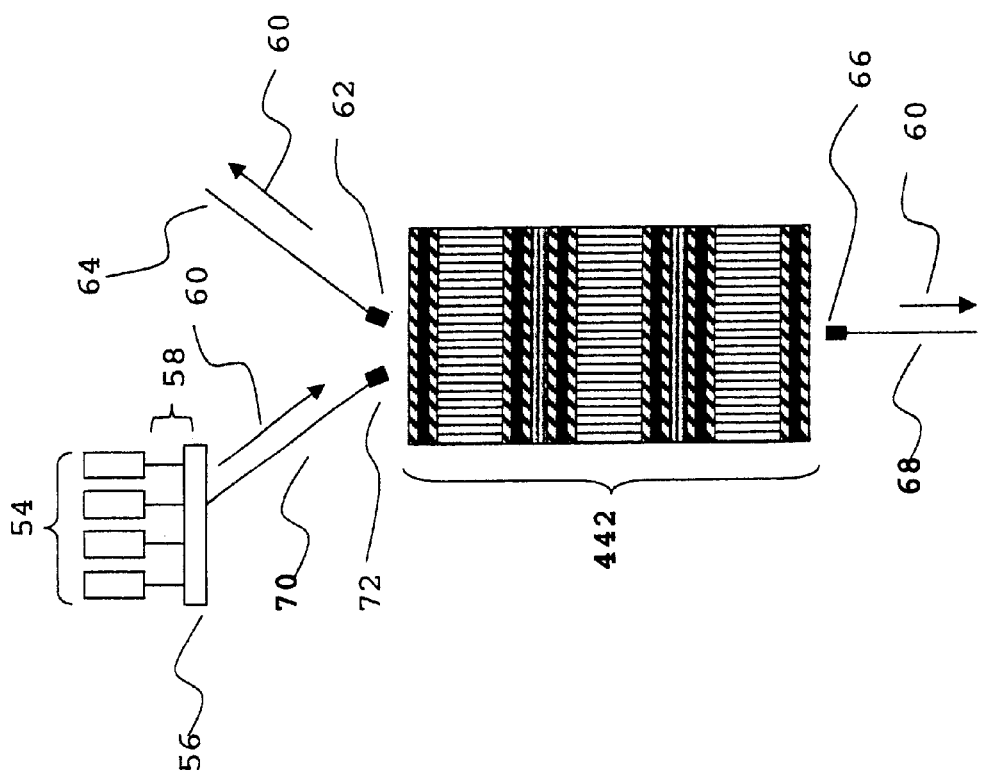
FIG. 5 is a schematic section view of an optical system operative in a wavelength band according to a one preferred embodiment.

Referring to FIG. 5, which incorporates the optical system of FIG. 4 and expands the optical system to include at the first end multiple light sources 54 optically coupled to a multiplexer 56 with signal carrier 58. The signal carrier 58 is in turn optically coupled to a first port on a first one of the opposite surfaces of the interleaver 442 using a second signal carrier 70 with a collimator 72 at its launching end. The flow of signal through the system is denoted by the arrow 60. The interleaver 442 comprises optically matched and optically coupled etalons described more fully in FIG. 7. Signal reflected from the first of the opposite surfaces of the interleaver is received by the collimator 62 coupled to signal carrier 64. The signal passed by the interleaver 442 is received by collimator 66 coupled to signal carrier 68. Both the reflected signal and the passed signal can then be further processed. One skilled in the art, given the benefit of this disclosure, will be able to determine what type of further processing the signal will need for the particular optical system being used.

Figure 6:
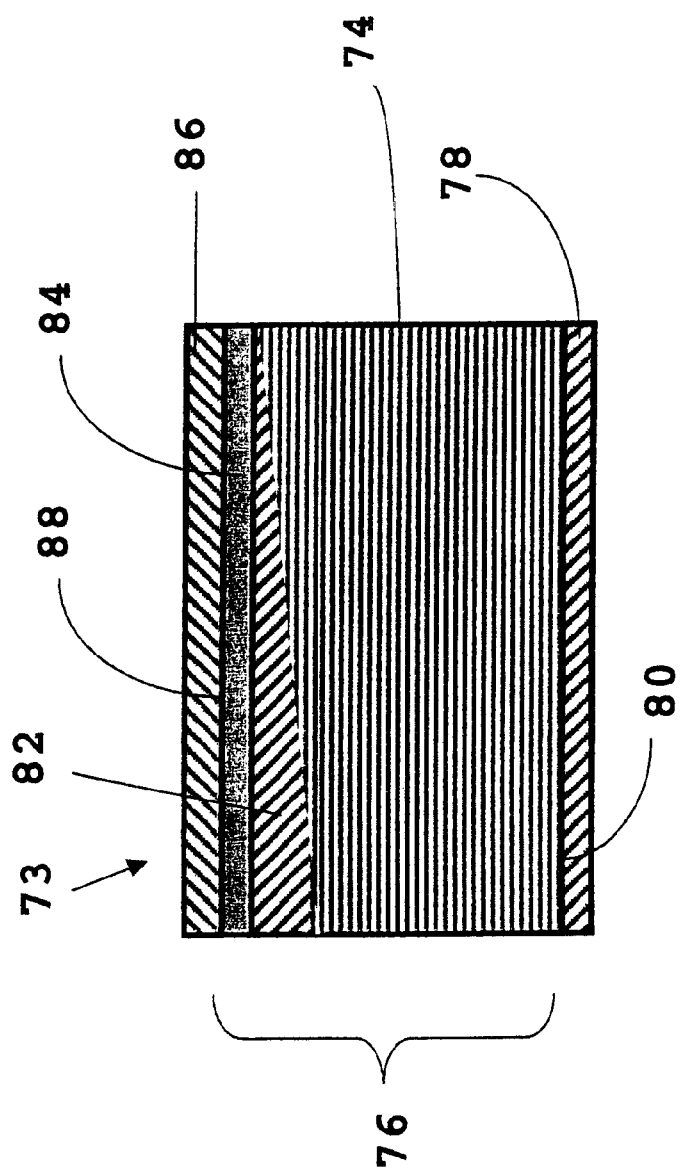
FIG. 6 is a schematic section view of an etalon which forms part of an optical system operative in a wavelength band according to a first preferred embodiment.

Referring now to FIG. 6, an etalon 73 is seen to comprise a first thin film mirror coating 78 on surface 80 of bulk optic 76 which forms the etalon's cavity. Second selectively transparent thin film mirror 86 is deposited on parallel opposite surface 88 of the bulk optic. The two thin film mirror coatings 78 and 86 are shown as a continuous uniform thickness metal film, preferably identical layers. They are designed in accordance with known parameters to be selectively transparent to the wavelength(s) required by the intended use or application of the finished etalon. The bulk optic 76 comprises a solid, optically transparent body 74, wedge coating 82 overlying the optically transparent body, and thickness-adjustment layer 84 sandwiched between the wedge coating 82 and the thin film 86. The axial dimension of the bulk optic, i.e., the dimension of the bulk optic in the direction of light passage, defines the cavity spacing of the etalon. The precise optical thickness of the bulk optic will be adjusted slightly to compensate for the non-zero thickness of the metal films to preserve or optimize transparency at the precise wavelength(s) of interest. The optically transparent body 74 preferably is a monolithic body formed of silica or other suitable glass. The wedge coating and the thickness-adjustment layer each preferably is a layer of silica, glass, etc., most preferably being formed of the same material as the optically transparent body 74. Other suitable materials will be readily apparent to those skilled in the art given the benefit of this disclosure.

Wedge coating 82 can be seen in FIG. 6 to have a progressively increasing axial dimension from right to left in the cross-sectional view of FIG. 6. In a typical embodiment, the cross-sectional view obtained by cutting in a plane perpendicular to the plane of the paper in FIG. 6 would show a substantially constant axial dimension for the wedge layer. The combined thickness of wedge coating 82 and optically transparent body 74 is substantially constant over at least a large (i.e., sufficiently large for the intended use of the etalon) area of the etalon. Such parallelism is achieved in accordance with preferred embodiments through a combination of substrate polishing and the wedge coating. An optical wafer suitable for mounting in a sputtering chamber is subjected to a polishing process in accordance with known techniques and commercially available equipment. Such polishing processes typically produce finished substrates to within 2 arc seconds, preferably 1 to 2 arc seconds of wedge (shown exaggerated in FIGS. 6 and 7) and a wavefront error of less than 1/50 of a wave at 1550 min. Low wavefront error will be understood in this context to mean that the thickness variation across the substrate is controlled by (i.e., essentially due to) the wedge. A wedge coating is then formed on one or both surfaces of the substrate to compensate for, that is, to offset, the wedge; net wedge after the wedge coating can be reduced to less than 0.1 arc second, less than 0.01 in preferred embodiments. The wedge coating can be formed by physical vapor deposition techniques, such as magnetron sputtering, ion beam sputtering, or other sputtering method. Preferably the wedge coating is deposited on the optically transparent body by sputter deposition from a source in a vacuum chamber, the optically transparent body being mounted within the vacuum chamber without spinning during deposition and optionally asymmetrical to the source. That is, in accordance with certain embodiments, the substrate wafer is mounted in the vacuum chamber with no spinning and offset at an angle to the target or source. The thinner portion of the substrate is placed closest to the target to receive the highest rate of deposition. The thickest portion is furthest from the target. In preferred embodiments, the wedge coating is deposited so that the thickness of the wedge coating at its thickest point is less than 1 micron and more preferably less than 100 nm. Alternatively or in addition, shielding or other techniques can be used to achieve differential deposition rate across the substrate wafer. It will be within the ability of those skilled in the art to determine the proper distance and angle of offset to obtain good yield of wafer surface area having substantially uniform thickness. In that regard, substantially uniform, as that term is used here, means that the thickness of the wafer, including the bulk optic plus the wedge-correction layer, is sufficiently uniform over an area the size of a chip or segment to be cut later from the wafer, most preferably a large number of such chips or segments, to provide satisfactory optical precision in or as an etalon. Similarly, the precision of the thickness of the bulk optic with the thickness-adjustment layer added during thickness correction must be sufficient to provide satisfactory optical precision in the functioning of the etalon. According to one preferred embodiment, the deposition of the layers will be done using suitable optical monitoring techniques. Suitable optical monitoring techniques are known, including, for example, that disclosed in U.S Pat. No. 6,110,337 to Sullivan et al., entitled Sputtering Method and Apparatus with Optical Monitoring, the entire disclosure of which is hereby incorporated by reference.

Figure 7B:
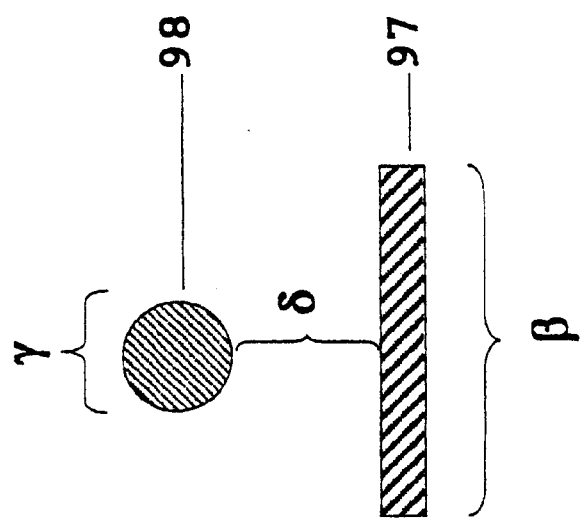
FIGS. 7a is a schematic section view and FIG. 7b is a frontal view of a substrate positioned within a deposition chamber.
Figure 7A:
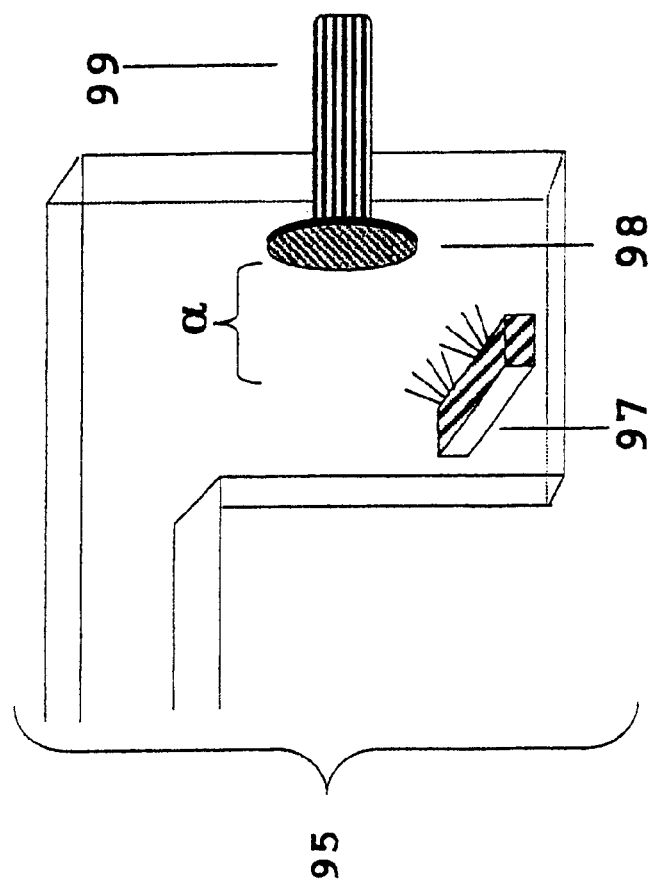

It will be within the ability of those skilled in the art to select or empirically determine suitable orientations and positions of the substrate within a deposition chamber to achieve suitable deposition of wedge coating onto the substrate. Referring to FIGS. 7a and 7b, an embodiment of a chamber suitable for depositing a wedge coating onto a substrate is shown. The chamber 95 comprises an elongate source or target 97, e.g. a rectangular source, and a substrate 98, for receiving a wedge coating, which is held in place by device 99. In preferred embodiments, the length β of target 97 is about three times larger than the diameter γ, or other length as the case may be, of the substrate 98. Target 97 may be positioned at distances α and δ from substrate 98. One skilled in the art, given the benefit of this disclosure, will be able to select or empirically determine dimensions for α and δ to achieve suitable deposition of wedge coating onto the substrate. The wedge coating is typically deposited without spinning substrate 98, and substrate 98 is positioned in the chamber so that the thinner portion of the substrate is placed closest to target 97 to receive the highest rate of deposition.

Total coating thickness to substantially eliminate a 1 arc second wedge is typically about 4–8 quarter waves (of the intended light wavelength that the etalon will be used with) depending on source geometry. Preferably the coating is controlled by optical monitoring, most preferably monitoring of two points on the wafer substrate during deposition. Coating can be halted when the thickness is the same at the two points along the direction of wedge. It should be noted that for clarity of explanation, the optically transparent body is still treated here as having its original wedge; the bulk optic comprising both that body and the wedge layer has the substantially constant net thickness.

As used herein, a bonding layer is any layer of bonding material on a surface of an etalon and used to physically attach that etalon to an adjacent etalon. The bonding layer optionally is in the light path through the stacked etalon and serves also to optically couple the adjacent etalon. In such embodiments, preferably the thickness of the bonding layer is equal to an odd number of quarter wavelength optical thickness (QWOTs). The bonding layer may comprise any of numerous materials suitable for bonding etalons together including, but not limited, to adhesives, fritted glass, or other suitable materials. In other embodiments, the bonding layer is omitted and optical contacting is used to attach an etalon to an adjacent etalon. Optical contacting can result in optically zero thickness, e.g. near zero thickness or approximately zero QWOTs, between adjacent etalons.

For an etalon intended for use as one of multiple stacked etalons in an optical element in an optical telecommunication system, the wavefront error will preferably be less than 1/50 of a wave at 1550 nm. Preferably, for stacked, directly optically coupled etalons suitable for use in optical systems, the wedge coating brings parallelism of the opposite surfaces of each bulk optic body from the 1 to 2 arc seconds of wedge mentioned above to less than 0.1 arc seconds, most preferably less than 0.01 arc seconds.

In the preferred embodiment of FIG. 6, the thin film coatings each comprises a sputter-deposited mono-layer of metal, that is, a single layer of metal such as would be deposited by sputter deposition without any intervening or other deposited layers (excepting, for example, anti-reflection films, transparent protective overcoats or the like, as those skilled in the art would recognize), and preferably without any intervening change of target material, vacuum chamber atmosphere or the like during deposition of the mono-layer. Exemplary metal layers (understood to include impurities, trace elements, optionally doping agents or the like, and to have an actual deposited form which may not be entirely a true metallic form) include silver, aluminum, tantalum, zirconium and magnesium. Other suitable materials will be readily apparent to those skilled in the art given the benefit of this disclosure. Such metal mono-layers in certain embodiments are slightly absorptive and the resulting etalon can be advantageously adapted for use as an induced transmission filter, useful for example in optical elements for certain medical applications.

As noted above, the bulk optic component of the etalon of the interleaver of FIG. 6 comprises a thickness-adjustment layer 84 of substantially uniform thickness. Such layers may typically be between e.g. 0 and 100 microns thick, typically between about 1 and 10 microns thick, preferably less than about 5 microns thick, for example about 2 microns thick. In accordance with certain preferred embodiments of the optical system disclosed here, the thickness adjustment layer is deposited onto the optically transparent body of the bulk optic by physical vapor deposition, i.e magnetron or ion beam sputtering in a vacuum chamber, with the bulk optic (alone or as part of a larger substrate, such as a typical 6 inch or larger substrate wafer used in the production of optical filters) spinning during deposition in accordance with known techniques. Optical monitoring can be used to control deposition of the thickness-adjustment layer. The deposition is controlled such that total thickness achieves the desired half wave condition for the bulk optic component of the interleaver, which corresponds to the wavelength at which the etalon is to be resonant.

Figure 8:
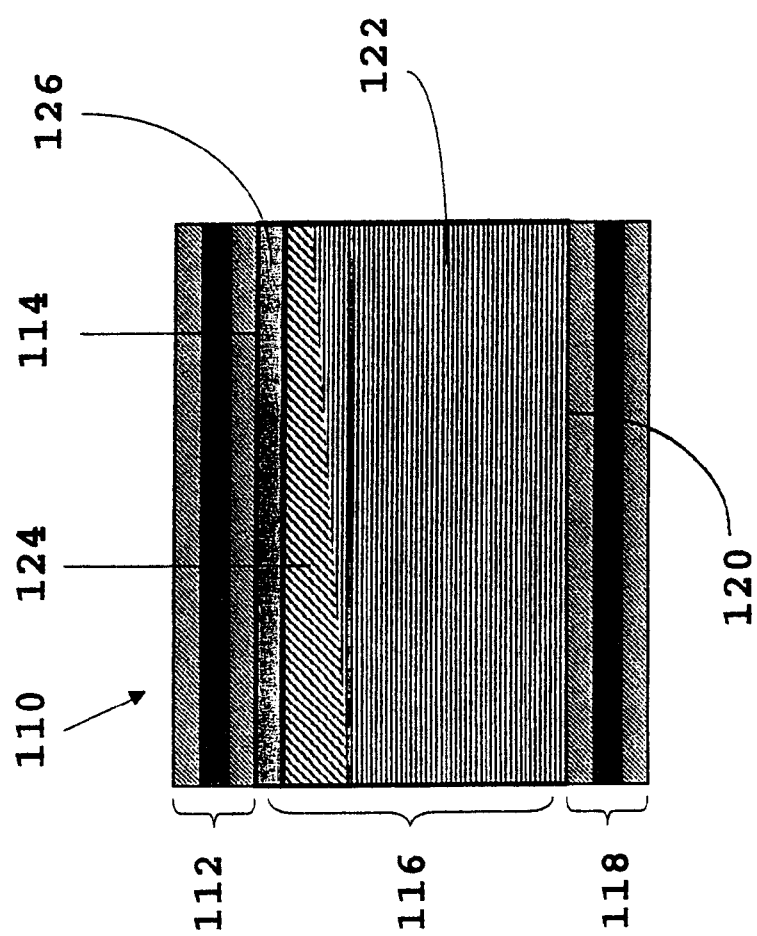
FIG. 8 is a schematic of an etalon, which forms part of an interleaver suitable for use in certain preferred optical system embodiments.

Referring now to FIG. 8, an etalon 110, suitable for use in the optical system described here, is seen to comprise a first thin film coating 112 on surface 114 of bulk optic 116 which forms the etalon's cavity. Second thin film 118 is deposited on parallel opposite surface 120 of the bulk optic. The bulk optic 116 comprises a solid, optically transparent body 122, wedge coating 124 overlying the optically transparent body, and thickness-adjustment layer 126 sandwiched between the wedge coating 124 and the thin film 112. The axial dimension of the bulk optic, i.e., the dimension of the bulk optic in the direction of light passage, defines the cavity spacing of the etalon. The optically transparent body 122 preferably is a monolithic body as described above in connection with the embodiment of FIG. 8. Materials suitable for the optically transparent body, wedge coating and thickness-adjustment layer include those discussed above. The Fabry-Perot thin film mirror coating 112 and 118 in the embodiment of FIG. 7 are dielectric film stacks of alternating high and low index of refraction. That is, the two thin film mirror coatings 112 and 118 are formed of alternating sputtering-deposited layers of low refractive index material and high refractive index material, often referred to as H/L/H film stacks. For representative purposes, each is shown as having three films in its film stack; typically, as is well known to those skilled in the art, film stacks comprising many more alternating films may be used to achieve desired optical performance characteristics. Typically, coatings 112 and 118 will have substantially identical film stacks. Selecting a suitable number of alternating layers and suitable film materials will be within the ability of those skilled in the art given the benefit of this disclosure. Preferably the film stacks are deposited by reactive magnetron sputtering, ion beam sputtering or other suitable technique, a number of which will be readily apparent to those skilled in the art given the benefit of this disclosure. Exemplary dielectric materials for the high refractive index layers of the film stack include $Ta_2O_5$, $ZrO_2$, and $Al_2O_3$. Exemplary dielectric materials for the low refractive index layers of the film stack include $SiO_2$ and MgF. Additional suitable materials will be readily apparent to those skilled in the art given the benefit of this disclosure.

In accordance with another preferred embodiment of the present disclosure, the wedge coating is deposited onto the optically transparent body of the bulk optic by physical vapor deposition, i.e magnetron sputtering or ion beam sputtering in a vacuum chamber, with the bulk optic (alone or as part of a larger substrate, such as a typical 6 inch or larger substrate wafer used in the production of optical filters) not spinning during deposition. Preferably the coating is a low defect coating to allow optical contact bonding or other optical coupling of the stacked etalons. Deposition can be otherwise in accordance with known techniques, whose applicability and manner of implementation will be within the ability of those skilled in the art given the benefit of this disclosure. The substrate is oriented at an angle to the target or otherwise arranged to receive progressively different deposition rates from one edge to the opposite edge. The target is preferably a linear source to provide a coating with a roughly linear profile. Preferably, the target is tangential to the circumference of the substrate and is about four times as large as the substrate, e.g. for a 6 inch diameter substrate the target can be about 20 inches long. The thinnest point of the substrate is positioned closest to the target or otherwise oriented or favored to have the fastest rate of deposition. Conversely, the thickest point is positioned or oriented to have the lowest deposition rate. Thus, the sputtered material will deposit fastest and, therefore, the most heavily, i.e., the thickest, where the bulk optic was thinnest, with progressively thinner deposition toward the area where the least was wanted. Since the substrate is not spinning and is oriented or arranged as just described, the thickness of the resulting wedge coating will change progressively (hence the term "wedge"), with the change in the thickness of the wedge coating being opposite that of the underlying body. The net effect is that the thickness of the bulk optic is substantially uniform over all or a large portion of its area. Where the bulk optic is prepared in the form of a typical substrate wafer, thin films can then be deposited to complete the etalon (subject to any further production or packaging steps etc.) in the same or a different sputter deposition chamber. Deposition of a wedge coating and thin films on another, second surface of the bulk optic may be performed in accordance with the embodiments described here.

In accordance with another aspect, etalons of the interleaver(s) incorporated into optical systems disclosed here, most preferably all of the stacked etalons of the interleaver, each comprises a thickness-adjustment layer of substantially uniform thickness on at least one of the two surfaces of the optically transparent body. As used herein, substantially uniform thickness means the thickness of the layer across the surface of the bulk optic is approximately constant. The thickness-adjustment layer, further described below, establishes the desired thickness of the bulk optic cavity of the etalon. The bulk optic is a solid, optically transparent (at the wavelengths of interest) body whose thickness, i.e. the dimension between the selectively transparent, parallel surfaces, including the thickness-adjustment layer, defines the cavity spacing. In particular, the bulk optic, including the thickness-adjustment layer, will typically have an optical thickness equal to an integral number of half waves at the same or all points for the wavelength(s) of interest. In preferred embodiments, the selectively transparent surfaces are Fabry-Perot thin film coatings comprising, for example, a film stack of alternating high and low refractive index oxides or a metal thin film in accordance with known thin film technologies. As described further below, the bulk optic can be diced from a wafer on which a thickness-adjustment layer and the two Fabry-Perot thin film coatings have been deposited by magnetron sputtering, ion beam sputtering, or other known deposition techniques. For stacked, optically coupled etalons intended for use as one of a plurality of stacked etalons of an interleaver in an optical system, the wavefront error will preferably be less than $\frac{1}{50}$ of a wave at 1550 nm.

In accordance with another aspect of this invention, methods are provided for making an interleaver. Such methods comprise the step of polishing at least one surface of an optically transparent substrate to produce an optically transparent body having opposite sides parallel preferably to within 5 arc seconds, more preferably to within 2.0 arc seconds. As discussed above, typical commercial processes do not reliably give adequate thickness and/or parallelism for good yield of etalons intended for use in optical systems, etc. The methods further comprise depositing an optically transparent wedge coating on at least one of the opposite sides of the optically transparent body to produce a bulk optic having opposite sides parallel to within less than about 0.4 arc seconds, more preferably less than about 0.2 arc seconds, most preferably, for higher performance etalons, less than 0.1 arc second. Continual two-spot optical monitoring can be used to control deposition of the wedge coating as disclosed above. Reference here to "continually" monitoring thickness during deposition should be understood to meaning optionally, but not necessarily, monitoring continuously, and optionally monitoring regularly or repeatedly during the deposition.

The methods further comprise depositing a first selectively transparent thin film mirror coating on a first one of the opposite sides of the bulk optic and depositing a second such thin film coating on a second one of the opposite sides of the bulk optic to produce an etalon wherein the thickness of the bulk optic defines the cavity spacing of the etalon of the interleaver.

In accordance with certain preferred embodiments of the method described immediately above, approximately one-half of the total thickness of the desired wedge coating is deposited by sputter deposition, without rotation, onto a first side of an optically transparent substrate. The substrate and wedge coating may, for example, both be $SiO_2$. The first thin film coating is deposited over such wedge layer. The second one-half of the total thickness of the desired wedge coating then is deposited by sputter deposition, without rotation, onto the second side of the optically transparent substrate. Further, deposition then continues until sufficient quarter waves are coated onto this second half of the wedge to reach the desired total thickness, stopping deposition at a half wave condition. In accordance with certain preferred embodiments, the thickness-adjustment layer has a substantially uniform thickness between 0 and 100 microns more preferably between 1–5 microns. The second thin film coating is deposited over the wedge/thickness correction layer. In accordance with certain preferred embodiments, the first thin film coating and the second thin film coating are substantially identical and substantially optically transparent to at least one wavelength for which the interleaver is resonant. Preferably, the transparent substrate is a wafer having a diameter greater than 3 inches and a thickness dependent on the intended optical properties. For production of optical bandpass filters, for example, for use in an optical systems in the C-band, a wafer having a thickness of about 0.5 mm is suitable with a finished thickness, after deposition of the wedge coating and thickness-adjustment layer, of about 0.5 mm for the etalon cavity. For interleavers intended for the same application, but having a bandpass every 100 GHz, a substrate wafer having a thickness of about 1.0 mm is suitable. For interleavers intended for the same application, but having a bandpass every 50 GHz, a substrate wafer having a thickness of about 2.0 mm is suitable. In general, it will be within the ability of those skilled in the art, given the benefit of this disclosure, to select substrate wafers of suitable thickness for forming the bulk optic cavity of the optical element disclosed here. Similarly, it will be within the ability of those skilled in the art given the benefit of this disclosure, to deposit wedge coatings and thickness-adjustment layers of suitable thickness on such substrate wafers to produce etalon cavities having an optical thickness proper for the intended application of the optical element. The method further comprises the step of dicing the wafer into multiple coupons and/or etalons following deposition of the first and second thin film coatings. Dicing the wafer typically is accomplished by sawing or grinding through the wafer in accordance with methods and equipment whose applicability to the present invention will be readily apparent to those skilled in the art given the benefit of the present invention. The parallel sides of such diced coupons, having the thin film coating thereon, preferably are 0.5 to 5.0 mm across the largest dimension.

In accordance with preferred embodiments, after deposition of the thin film stacks overlying the bulk optic, transition layers and thin film etalons can be deposited prior to removal of the etalon from the deposition apparatus, e.g. the thin film etalon may be deposited continuously after deposition of the wedge coating, thickness-adjustment layer, and thin film mirror coatings of the bulk optic etalon. That is, transition layers and thin film etalons may be deposited in a continuous manner after assembly of the bulk optic etalon. A first transition layer comprising materials similar to the bulk optic, wedge coating, and thickness-adjustment layer, such as silica for example, may be deposited onto the thin film stacks of the bulk optic etalon. After depositing a first transition layer, first thin film coating, such as an H/L/H thin film stack for example, may be deposited, in accordance with the methods and embodiments discussed above. A cavity film may subsequently be deposited onto the thin film coating overlying the first transition layer. The cavity film may comprise any suitable material known to those skilled in the art including but not limited to those materials disclosed above that comprise the bulk optic etalon. After deposition of the cavity film, second thin film coating, such as an H/L/H thin film stack for example, may be deposited onto the cavity film. Prior to deposition of additional thin film etalons, transition layers may be deposited to separate the multiple thin film etalons. One skilled in the art, given the benefit of this disclosure, will be able to deposit additional transition layers and thin film etalons suitable for use in optical systems and optical sensors, such as those used in the telecommunications industry.

Figure 9:
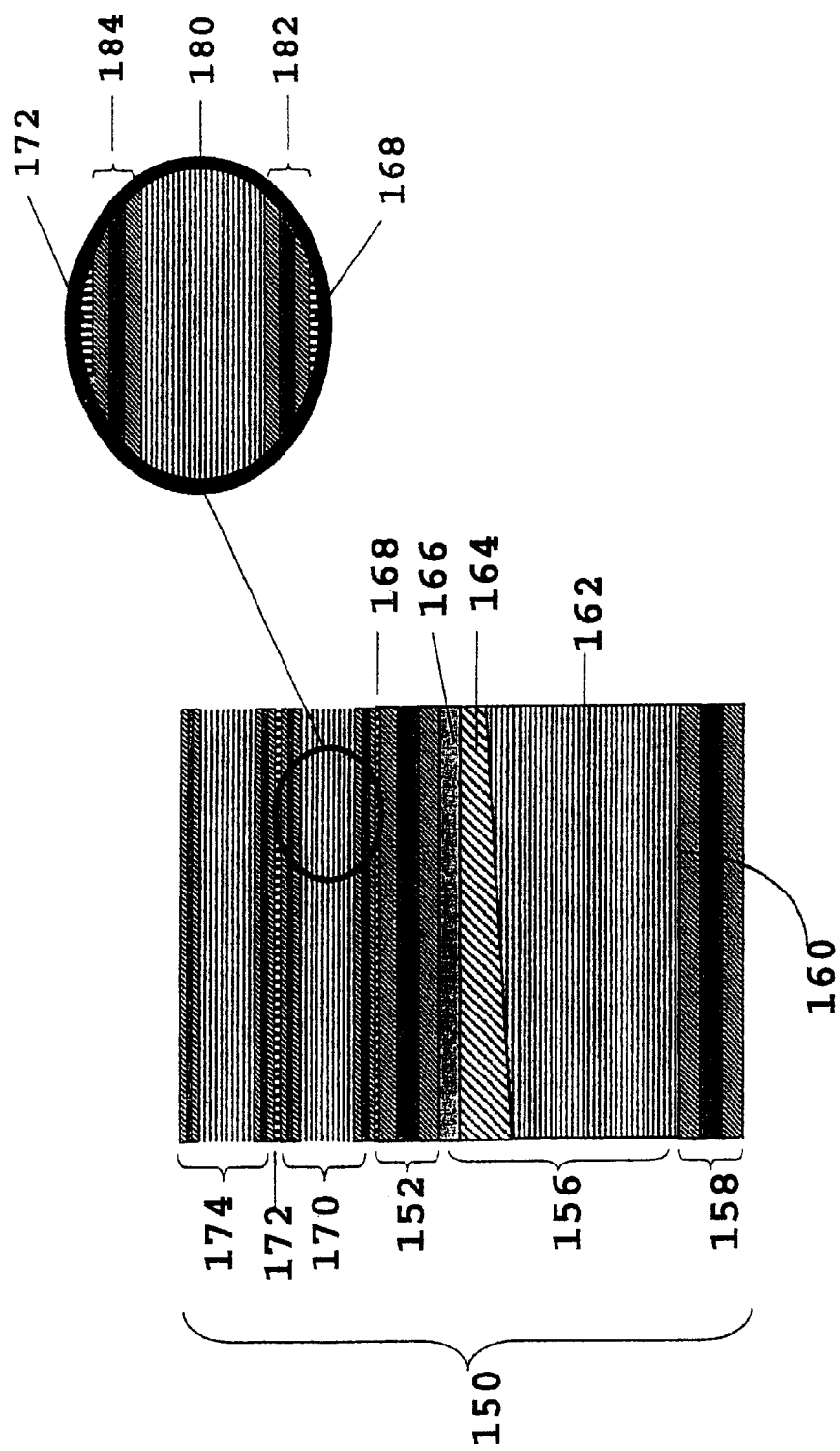
FIG. 9 is a schematic section view of an etalon comprising a thin film cavity deposited thereon and suitable for use in the interleaver described here.

In accordance with certain preferred embodiments, FIG. 9 illustrates a multi-cavity interleaver 150 comprising a bulk optic 156, thin film coatings 152 and 158, transition layers 168 and 172, and thin film etalons 170 and 174. Bulk optic 156 comprises an optically transparent body 162 and optionally a wedge coating 164 and thickness adjustment layer 166. On first side 160 of the bulk optic is thin film mirror coating 158. On the opposite side of the bulk optic is thin film mirror coating 152. After deposition of thin film mirror coatings 152 and 158, additional thin film coatings and cavity films may be deposited onto thin film coating 152 and/or onto thin film coating 158. Prior to deposition of the thin film coatings and cavity films of the thin film etalon, a first transition layer 168 is deposited using sputtering or other suitable techniques, e.g. ion beam sputtering, magnetron sputtering, etc. The first transition layer 168 is in direct surface-to-surface contact with thin film stack 152. Thin film coating 182, such as an H/L/H thin film stack for example, may be deposited onto transition layer 168. After deposition of thin film coating 182, a cavity film 180 may be deposited onto thin film coating 182. After deposition of the cavity film 180, second thin film coating 184 may be deposited onto cavity film 180. Therefore, a thin film etalon typically comprises a first thin film coating or stack, the cavity film, and a second thin film coating or stack. A second transition layer 172 may be deposited onto first thin film etalon 170, and the process just described may be repeated to provide deposition of additional thin film etalons, such as thin film etalon 174. In preferred embodiments, the thickness of the transition layer typically is an odd integer number (e.g. 1, 3, 5, 7 . . . ) of quarter wavelengths optical thickness (QWOTs). Typically the cavity film of the additional thin film etalons is deposited to a half-wave condition or an integral number of half waves. For example, in certain embodiments, the thickness of the cavity film can be from 1 to 10 half waves corresponding to about 0.5 to 5 microns for silica cavity film in an etalon operative in the C band. The thickness of the thin film coatings, of the thin film etalons, is preferably equal to an integral number of half waves.

Figure 10:
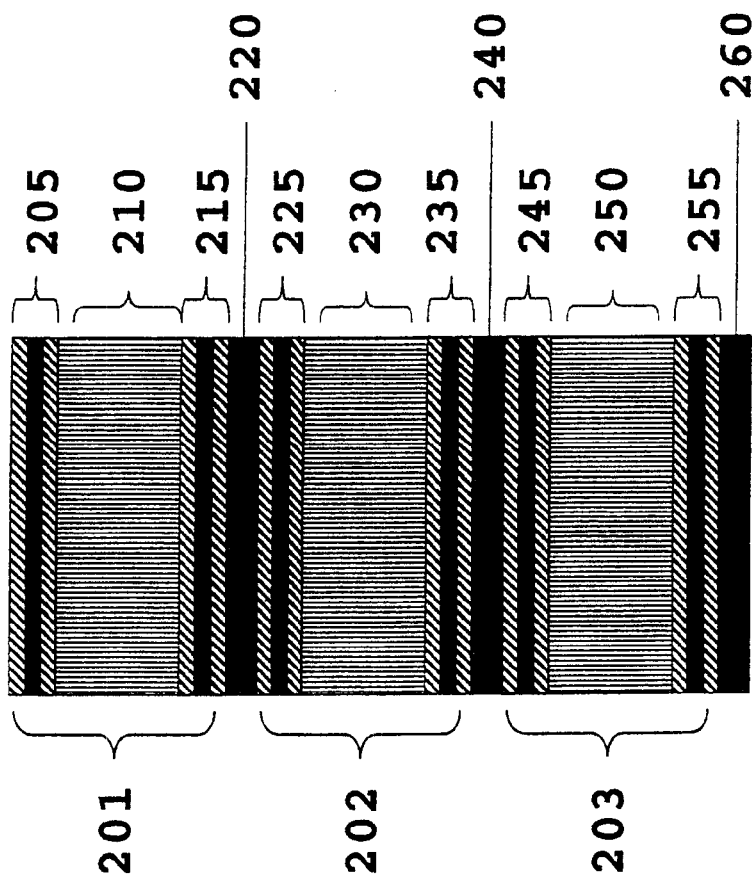
FIG. 10 is a schematic of an interleaver comprising a spacer layer, suitable for use in certain preferred optical system embodiments.

FIG. 10 illustrates schematically a preferred embodiment of the interleaver disclosed here. One skilled in the art, given the benefit of this disclosure, will be able to assemble stacked, optically coupled etalons, comprising the interleavers described above. For convenience sake and for clarity, however, the etalons in the stacked, optically coupled etalons shown and described here comprise the components of the etalons shown in FIG. 6 and/or FIG. 8. Referring to FIG. 10, each interleaver may comprise the components of the etalon shown and described in FIG. 6 including a bulk optic 210 comprising thin film coatings 205 and 215. A first etalon 201, comprising the thin film coatings 205 and 215 and a bulk optic 210, is coupled to a second etalon 202, comprising thin film coatings 225 and 235 and a bulk optic 230, using an optically transparent bonding layer 220. The second etalon 202 is coupled to a third etalon 203, comprising thin film coatings 245 and 255 and bulk optic 250, using a transparent bonding layer 240. Each bulk optic may also comprise a thickness adjustment layer (not shown) and a wedge coating (not shown) underlying the thin film coatings. Additional etalons may be joined to the interleaver described herein, e.g. by joining additional etalons via layer 260, which comprises a transparent bonding material. The number of coupled etalons is not limited to the number shown and described herein. One skilled in the art, given the benefit of this disclosure, will recognize that a plurality of etalons may be coupled together by addition of more bonding layers and more etalons to the interleaver.

In accordance with certain preferred embodiments, the bonding material in layers 220, 240, and 260 shown in FIG. 10 may each comprise any optically transparent material that is capable of bonding two or more etalons together to form the interleaver. In preferred embodiments, the bonding material is deposited to a thickness equal to an odd number of QWOTs after the etalons are joined together. In certain embodiments, fritted glass is used to join the etalons together. The fritted glass is preferably deposited using a vapor deposition process or a sputter deposition process. The fritted glass may be deposited on both surfaces of a wafer, a coupon or an etalon. Alternatively, the fritted glass may only be deposited on one surface of a wafer, a coupon, or an etalon. The fritted glass is deposited so that the thickness of the fritted glass is equal to an odd number of QWOTs when the etalons are joined together to form the interleaver. After deposition of the fritted glass on the wafers, coupons or etalons, the fritted glass can be heated to melt or soften the fritted glass. Placement of the wafers, coupons, or etalons in contact and re-solidification of the fritted glass results in joining of the wafers, coupons, or etalons. One skilled in the art would recognize that materials with similar properties and characteristics as fritted glass may be used to join the etalons together. In certain embodiments, a portion of the fritted glass is etched away to leave "feet" or projections on the surfaces of the wafers, the coupons, or the etalons. The "feet" may be treated similar to the fritted glass to join the wafers, coupons, or etalons together. In certain preferred embodiments, the bonding material comprises an epoxy or other adhesive or small beads in an adhesive. In preferred embodiments, the small bead/adhesive mixture is deposited to form a monolayer of beads after the wafers, coupons, or etalons are joined together to form the interleaver. The uniform size of the beads provides for uniform spacing between adjacent coupled wafers, coupons, or etalons. In other preferred embodiments, the bonding material comprises EPO-TEK 353ND or other similar materials.

In additional preferred embodiments, the bonding layer is omitted and the etalons are placed into optical contact to form the interleaver. Without wishing to be bound by theory, it is currently understood that when placed into optical contact, electrostatic forces hold the etalons together. Optionally, a coupling member may be used to maintain the optical contact. This coupling member may be any device capable of maintaining the etalons in position in the stack, e.g. a rigid jacket, a sleeve, etc.

Figure 11:
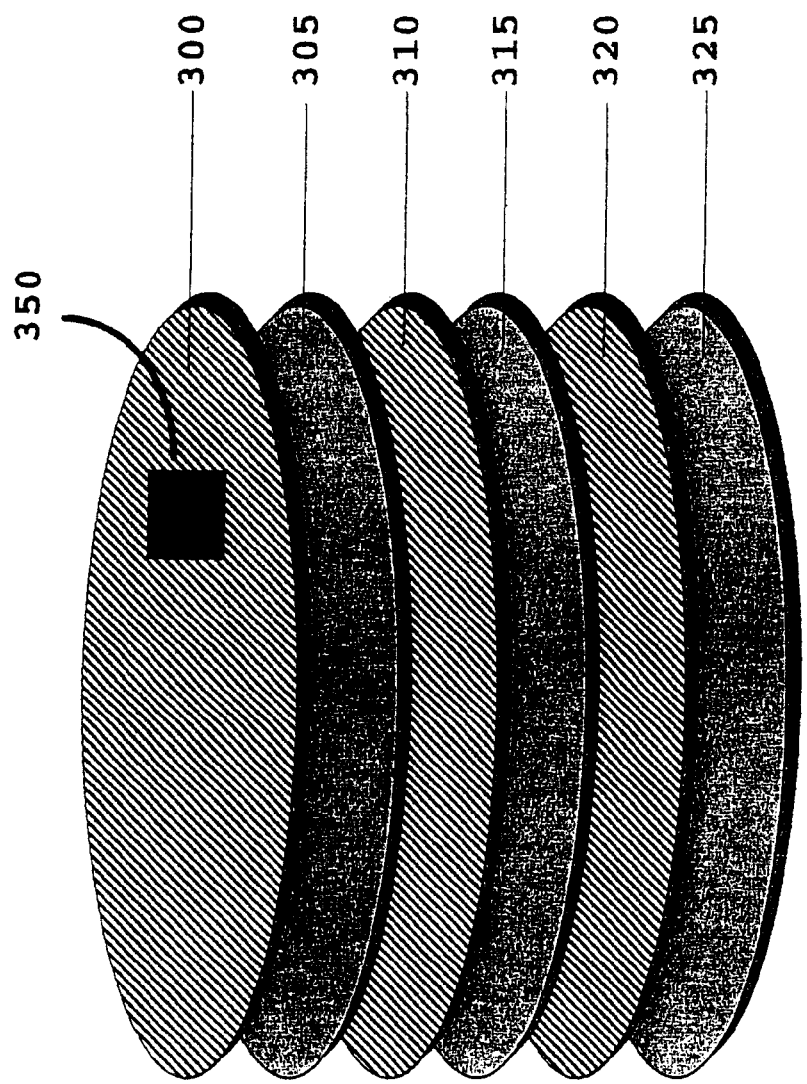
FIG. 11 is an exploded view of a stack of wafers, each coated on both sides and suitable to be diced into bulk-optic etalons that can be stacked to form interleavers for optical systems in accordance with certain preferred embodiments.

In accordance with certain preferred embodiments, an expanded view of a method for production of stacked, optically coupled etalons is shown in FIG. 11. In this embodiment, wafers are joined together using a bonding material. A first wafer 300 and a second wafer 310 each comprises a bulk optic and thin film coatings. The bulk optic of the wafers may optionally comprise a thickness adjustment layer (not shown) and a wedge coating (not shown) underlying the thin films. A bonding material may be deposited onto one or more of the surfaces of the first wafer 300 or the second wafer 310. Preferably this bonding material is deposited using vapor deposition, sputter deposition, or other deposition processes known in the art. One skilled in the art would recognize that deposition of the bonding material on both surfaces is possible, but unnecessary, since only a single bonding layer is required between wafers to join the wafers together. After joining of the first and second wafers, a bonding layer 305 is created. Preferably the thickness of bonding layer 305 is equal to an odd number of QWOTs. A bonding material is also deposited on the surfaces of a third wafer 320. Third wafer 320 may also comprise thin film coatings and a bulk optic that optionally comprises a wedge coating and a thickness-adjustment layer. After joining the third wafer 320 to the second wafer 310, a bonding layer 315 is created. Preferably, the thickness of bonding layer 315 is equal to an odd number of QWOTs. One skilled in the art, given the benefit of this disclosure, will recognize that additional wafers may be joined to the third wafer using the method just described. Preferably, the thickness of any additional bonding layers are each equal to an odd numbers of QWOTs.

Figure 12:
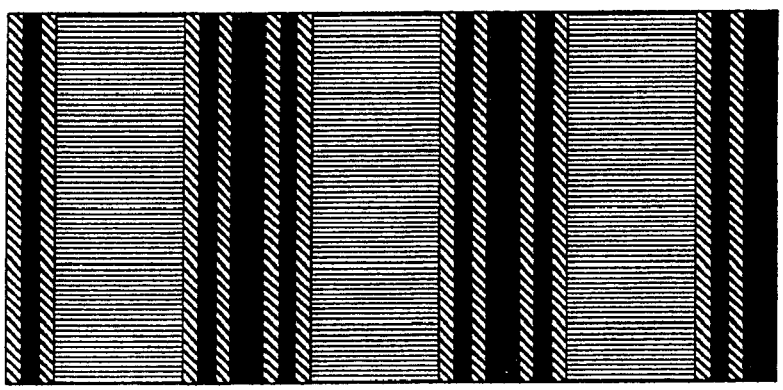
FIG. 12 is a section view of a stacked etalon diced from the stacked wafers shown in FIG. 11.

The method immediately described provides a robust and rapid method for rapidly assembling stacked wafers. In accordance with preferred embodiments, the wafers may but cut or diced into smaller fragments known as "coupons." The coupons may further be diced into one or more stacks of etalons forming interleavers as shown in FIG. 12. The diced stacks of etalons may be tested for specific properties. Stacks of etalons forming interleavers having similar properties, i.e. optically transparent to the same wavelength, may be incorporated into optical elements, optical communications devices, optical sensors, or optical systems.

Figure 13C:
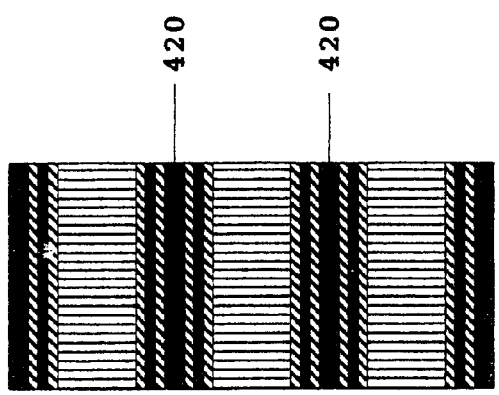
FIGS. 13a–13c is a sequential representation of one embodiment of a method for joining etalons using a bonding material.
Figure 13B:
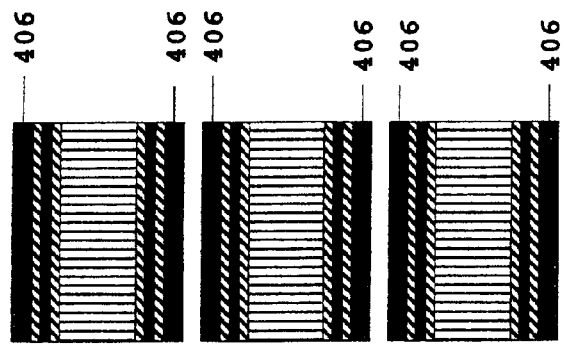
Figure 13A:
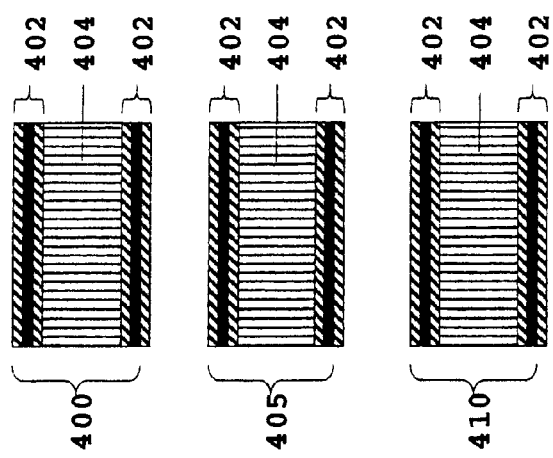

In accordance with certain preferred embodiments, a method for production of interleavers is shown in FIGS. 13a–13c. In this embodiment, individual etalons are stacked and coupled using bonding layers. A first etalon 400, a second etalon 405, and a third etalon 410 each comprise the components of the interleaver shown and described in FIG. 6, including thin film coatings 402 on both surfaces of a bulk optic 404 (see FIG. 13a). The bulk optic may also comprise a thickness adjustment layer (not shown) and a wedge coating (not shown) underlying the thin films. A bonding material 406 is deposited on the surfaces of the first, second, and third etalons forming the interleaver (see FIG. 13b). Preferably this bonding material is deposited using vapor deposition, sputter deposition, or other deposition processes known in the art. After joining the first, second, and third etalons, bonding layers 420 are created (see FIG. 13c). Preferably the thickness of each bonding layer is equal to an odd number of QWOTs. One skilled in the art would recognize, given the benefit of this disclosure, that additional etalons may be coupled to the third etalon using the method just described. The thickness of the bonding layers that would be created by adding additional etalons are preferably each equal to an odd number of QWOTs.

Figures 14A, 14B:
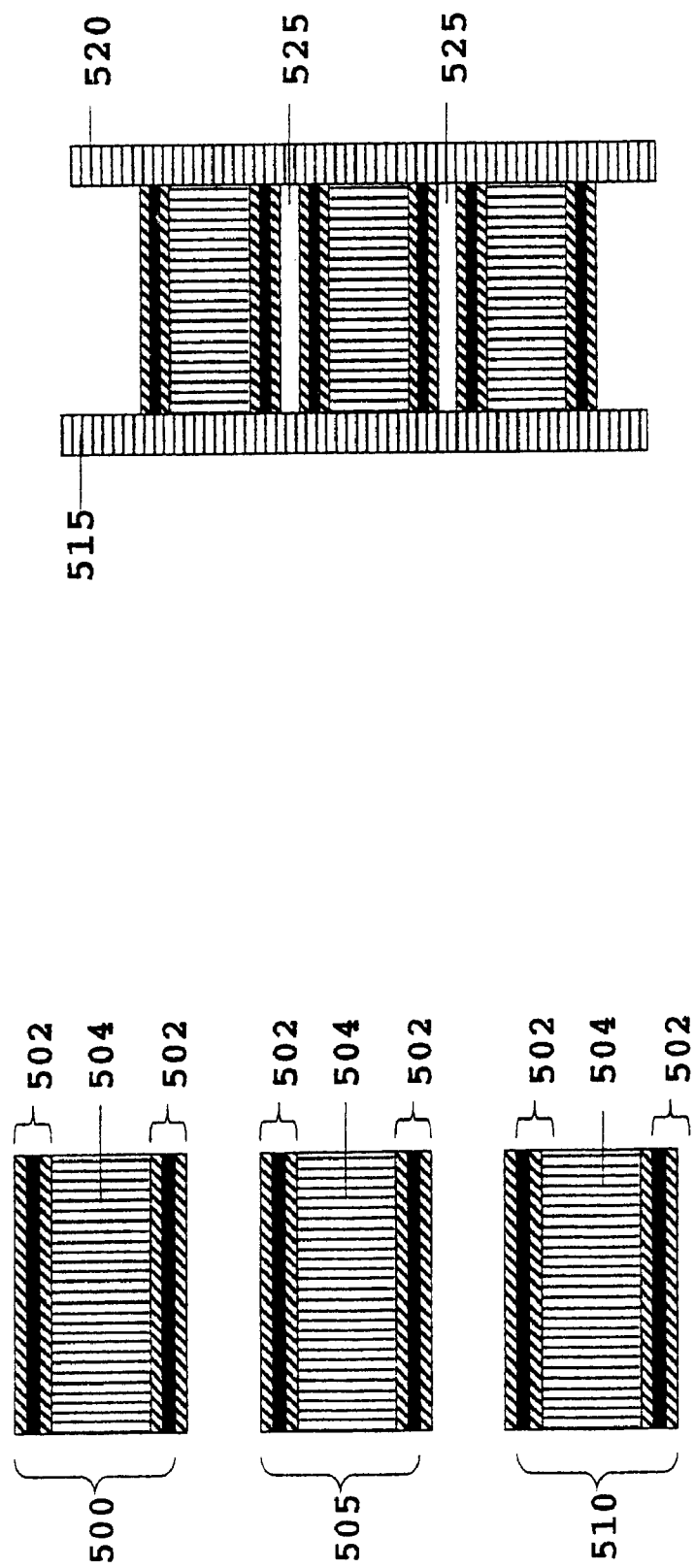
FIGS. 14a–14b is a sequential representation of a first embodiment of a method for optically coupling etalons using a coupling member.

In accordance with additional preferred embodiments, a method for production interleavers is shown in FIGS. 14a–14b. In this embodiment, the stacked, optically coupled etalons of the interleaver are in optical contact. A first etalon 500, a second etalon 505, and a third etalon 510 each comprise the components of the interleaver shown and described in FIG. 6 including thin film coatings 502 on both surfaces of a bulk optic 504 (see FIG. 14a). The bulk optic may also comprise a thickness adjustment layer (not shown) and a wedge coating (not shown) underlying the thin film coatings. A first coupling member 515 and a second coupling member 520 maintain optical contact between the first, second, and third etalons (see FIG. 14b). The space 525 between adjacent etalons may be filled with air or other substances depending on the intended application of the stacked, optically coupled etalons. The thickness of the space between adjacent etalons is preferably equal to an odd number of QWOTs. One skilled in the art would recognize, given the benefit of this disclosure, that additional etalons may be coupled to the third etalon using the coupling members 515 and 520 and the method just described.

Figure 15B:
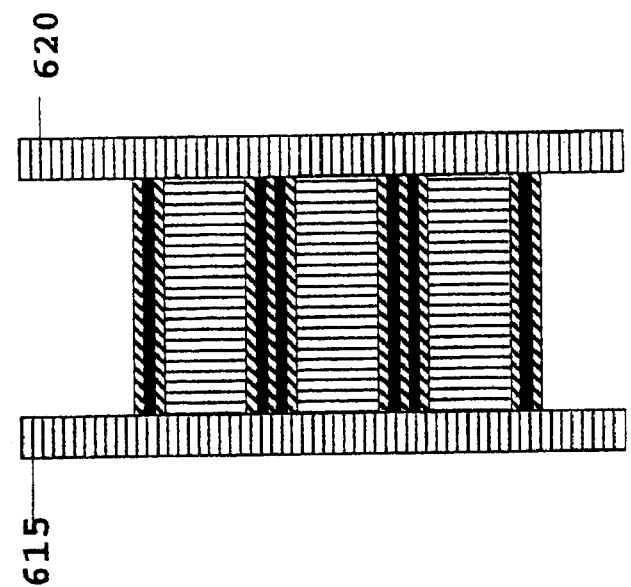
FIGS. 15a–15b is a sequential representation of a second embodiment of a method for optically coupling etalons using a coupling member.
Figure 15A:
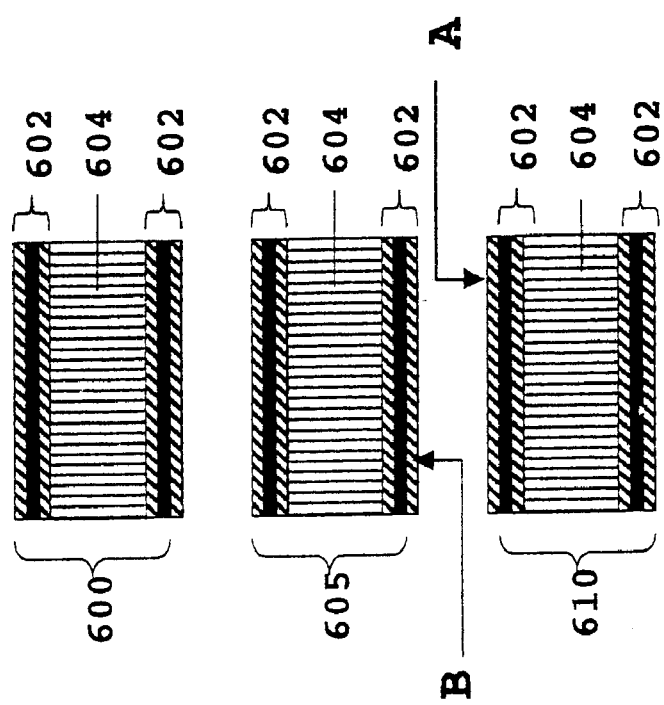

In accordance with additional preferred embodiments, a method for production of interleavers is shown in FIGS. 15a–15b. In this embodiment, the stacked, optically coupled etalons of the interleaver are in optical contact. A first etalon 700, a second etalon 705, and a third etalon 710 each comprise the components of the etalon shown and described in FIG. 6 including thin film coatings 702 on both surfaces of a bulk optic 704 (see FIG. 15a). The bulk optic may also comprise a thickness adjustment layer (not shown) and a wedge coating (not shown) underlying the thin films. In this embodiment, after joining of the etalons, there is no space between the etalon surfaces and a coupling member is not used (see FIG. 15b). Without wishing to be bound by theory, the etalons of the interleaver are held together by electrostatic forces between the surfaces of the thin film coatings. The thickness of the thin films may be altered to provide for the correct thickness after the etalons are coupled. For example, if the thin film comprises a high refractive index oxide layer, a low refractive index oxide layer, followed by a high refractive index oxide layer (HLH), then to insure the layers have the correct thickness after the etalons are joined, the thickness of the outermost (furthest from the surface of the bulk optic) high refractive index oxide layer may be reduced. That is, for example, the thickness of the outermost high refractive index oxide layer 702 of etalons 710 (see arrow A in FIG. 15a) and 705 (see arrow B in FIG. 15a), that will be in surface-to-surface contact may be reduced, e.g. by half, so that after joining adjacent etalons a thickness equal to an integral number of half waves is obtained, e.g. after joining adjacent etalons the thickness of each oxide layer preferably is equal to an integral number of half waves and thickness of each oxide layer is approximately the same. In this example, after joining the etalons the order of the oxide layers between bulk optic bodies would then be HLHLH, where each oxide layer has approximately the same thickness, e.g. an integral number of half waves. One skilled in the art would recognize, given the benefit of this disclosure, that additional etalons may be coupled to the third etalon using the method just described.

In accordance with another aspect of this invention, an optical system is provided comprising at least one interleaver as disclosed above. Such optical system may further comprise signal carriers, light sources and ports for receiving and transmitting demultiplexed signals. Also, such optical elements may comprise a temperature compensator joined to the stacked, optically coupled etalons. Suitable temperature compensators are known to those skilled in the art, including for example the temperature compensators disclosed in U.S. Pat. No. 5,982,488 to Shirasaki and in U.S. Provisional Application No. 60/275,920 titled "Iso-Optical Thermal Compensator and Methods of Making and Using Same," the entire disclosures of which are incorporated herein by reference for all purposes.

In accordance with another aspect of this invention, optical communication systems are provided comprising stacked, optically coupled etalons as disclosed above. It will be within the ability of those skilled in the art, given the benefit of this disclosure, to produce the interleavers disclosed here, suitable for use in optical systems.

Figure 16:
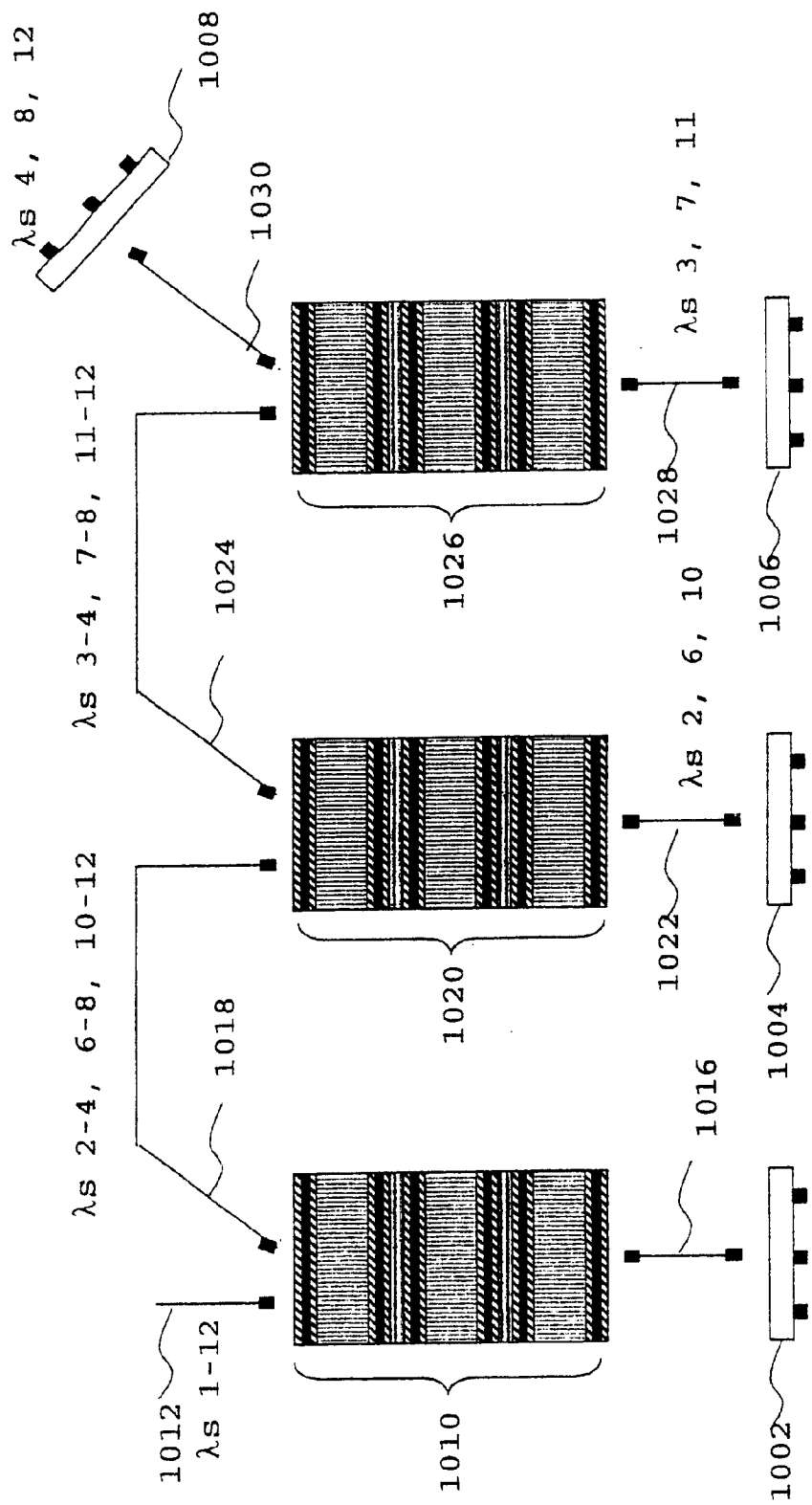
FIG. 16 is a schematic section view of an optical system operative in a wavelength band according to a one preferred embodiment.

In accordance with preferred embodiments, a signal comprising multiplexed wavelengths (sometimes referred to herein by the symbol "λ" or "λs" to explicitly indicate multiple wavelengths) 1–12 is launched into a 50 GHz interleaver 1000 from a signal carrier 1012 (see FIG. 16). The signal carrier 1012 has a launching end fitted with a collimator 1014. The 50 GHz interleaver 1010 allows a set of channels, λs 1–12, with 50 GHz spacing to be routed to two output fibers 1016, 1018, one capturing the reflected signal 1018 and one capturing the signal 1016 passed by the interleaver. The passed signal comprising λs 1, 3, 5, 7, 9, and 11, will have 100 GHz channel spacings. The channels of the reflected signal comprising λs 2, 4, 6, 8, 10, and 12, will also have 100 GHz channel spacings. That is, each will have 50 GHz wide channels separated by 50 GHz buffer zones from which the channel signals have been removed. The reflected signal received by signal carrier 1018 can then be further processed in accordance with the preferred embodiments described here. Specifically, the semi-demultiplexed signal is carried by line 1018 to the second interleaver 1020 and is filtered to reduce the level of any residual signal in λs 1, 3, 5, 7, 9, and 11. The signal passed by the interleaver 1020 comprises λs 2, 4, 6, 8, 10, and 12 and the signal carried away by line 1024 comprises such residual signal in the other channels, noise, etc. The passed signals from the interleavers 1010 and 1020 of the system are passed from the signal carriers 1016 and 1022 to arrays of individual passband filters operative to isolate the individual channels of the passed signals. In this way, individual wavelength passband filters designed for 100 GHz channels can be used in a more advanced optical system operating at 50 GHz. Considerable cost savings can be achieved in this way, since existing installed individual wavelength passband filters and other such optical system components can continue to be used, thereby avoiding both the component and labor costs associated with installing new components. In addition, individual wavelength passband filters and other such optical components designed for smaller channel spacings typically are more expensive to produce and may introduce undesirable optical effects.

Figure 18:
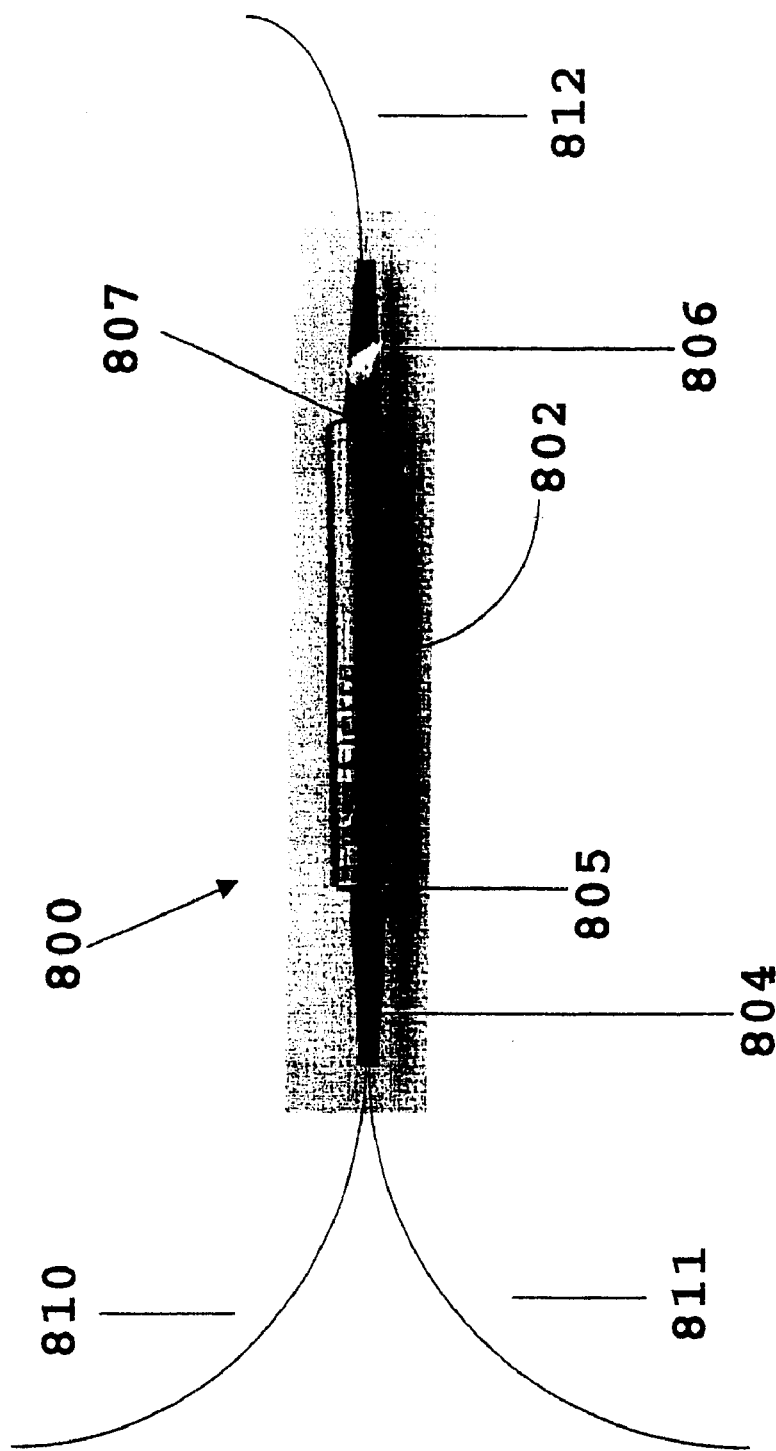
FIG. 18 shows an interleaver in accordance with a preferred embodiment, packaged for use in a fiber optic telecommunication system.

Referring now to FIG. 18, a packaged interleaver 800 suitable for use in a fiber optic telecommunication system is seen to comprise a cylindrical metal housing 802, preferably formed of stainless steel, aluminum, etc., and fiber guides 804 and 806. Fiber guides 804 and 806 formed of plastic or rubber conical fittings sealed to ends 805 and 807, respectively, of housing 802. Fiber guide 804 guides input fiber 810 and output fiber 811 into the interleaver where they are positioned and oriented by a ferrule of other suitable fitting in accordance with the disclosure above. Similarly, fiber guide 806 guides output fiber 812 where it is positioned and oriented by a ferrule of other suitable fitting. Interleaver 800 preferably has an axial dimension, including the fiber guides, preferably less than 6 inches, more preferably less than 4 inches, for example about 2–3 inches. The cylindrical housing 802 preferably has an outside diameter preferably less than about ½ inch, for example about ¼ inch. Other suitable packaging, for example other cross-sectional shapes and geometries, will be apparent to those skilled in the art, given the benefit of this disclosure and derived at least in part from the requirements of each particular application.

For illustrative purposes only and without limitation, examples of this novel technology are disclosed below.

EXAMPLES

Example 1

Optical System Employing Interleaver Comprising Stacked, Directly Optically Coupled Etalons In the optical system of this example, an interleaver is employed comprising stacked, bulk-optic etalons as disclosed above. More specifically, each of the etalons used in the interleaver of the preferred embodiment discussed in this example comprises a bulk optic defining the cavity spacing of the etalon, formed of a solid, optically transparent body with a wedge coating overlying the transparent body and a thickness adjustment layer overlying the wedge coating and underlying the selectively transparent thin film mirror coating on that side of the etalon.

The interleavers is prepared in accordance with the disclosure above and, more specifically, as follows. A 2 inch diameter wafer of silica approximately 0.5 mm thick is sliced from a log of that diameter. The wafer is planarized using commercial polishing techniques. The resulting wafer has a thickness of approximately 0.5 mm at its thickest point with a wedge angle of 2-arc sec. Additional thickness measurements establish that thickness changes progressively; that is, the thickness of the wafer varies substantially linearly from the thinnest to the thickest point. The wedge angle is corrected by adding a wedge coating. Specifically, the wafer is mounted in a vacuum chamber equipped for ion beam sputtering from an elongate silica target having a width greater than the diameter of the substrate wafer. The wafer is mounted stationary, i.e., without spinning, oriented at an angle of approximately 45 degrees to the target, with the thinnest point of the wedge closest to the target (for example, approximately 8 inches). During sputtering, the thickness of the wafer is continually optically monitored. Deposition is continued for up to three hours, after which optical monitoring indicates substantial uniformity of wafer thickness. The wafer is then removed from the vacuum chamber. The physical thickness of the wafer is measured and found to have less than about 10 nm of runout.

Following such wedge correction, the precise thickness of the bulk optic is adjusted by further coating with silica. Specifically, the wafer is mounted in a vacuum chamber equipped for sputtering from a silica target. The wafer is mounted for spinning during deposition, and thickness of the wafer is continually optically monitored. Deposition is halted when optical monitoring indicates that the total thickness of the bulk optic, including the original planarized wafer, wedge coating and thickness-correction layer, is within about 10 nm of desired thickness. An H/L/H type mirror stack (partial reflection) is then deposited on each surface of the wafer by sputtering the thin film stack comprising 3 alternating layers of silica and $Ta_2O_5$, for example. The etalon can be further tuned for wavelength, if necessary, using angle, heat treatment, strain, temperature control, or other means.

The wafer prepared as described above is diced into multiple separate etalons. Two or more, preferably 4 or 5 of the etalons so formed, all having substantially the same passband width of about 50 GHz and the same period of about 100 GHz are stacked together so as to form an interleaver in which the etalons are directly optically coupled. The interleaver is mounted to receive multiplexed signals comprising signals in each of multiple contiguous 50 GHz channels in the C Band, from the terminal end of an optical fiber. The end of the optical fiber is fitted with a collimator to launch the multiplexed signal at the input port of the first interleaver at an angle of incidence not greater than 1 degree. It is tested without temperature compensation at an operating temperature of 0 to 70 ° C. Performance results are shown in Table I below.

TABLE I

| | |
|---|---|
| Bandwidth (0.5 dB) | >0.25 nm |
| Insertion loss | <0.1 dB |
| Isolation (20 dB) | <0.75 nm |
| Polarization dependent loss (PDL) | <0.1 dB |
| Temperature coefficient | 0.012 nm/° C. |

Figure 17:
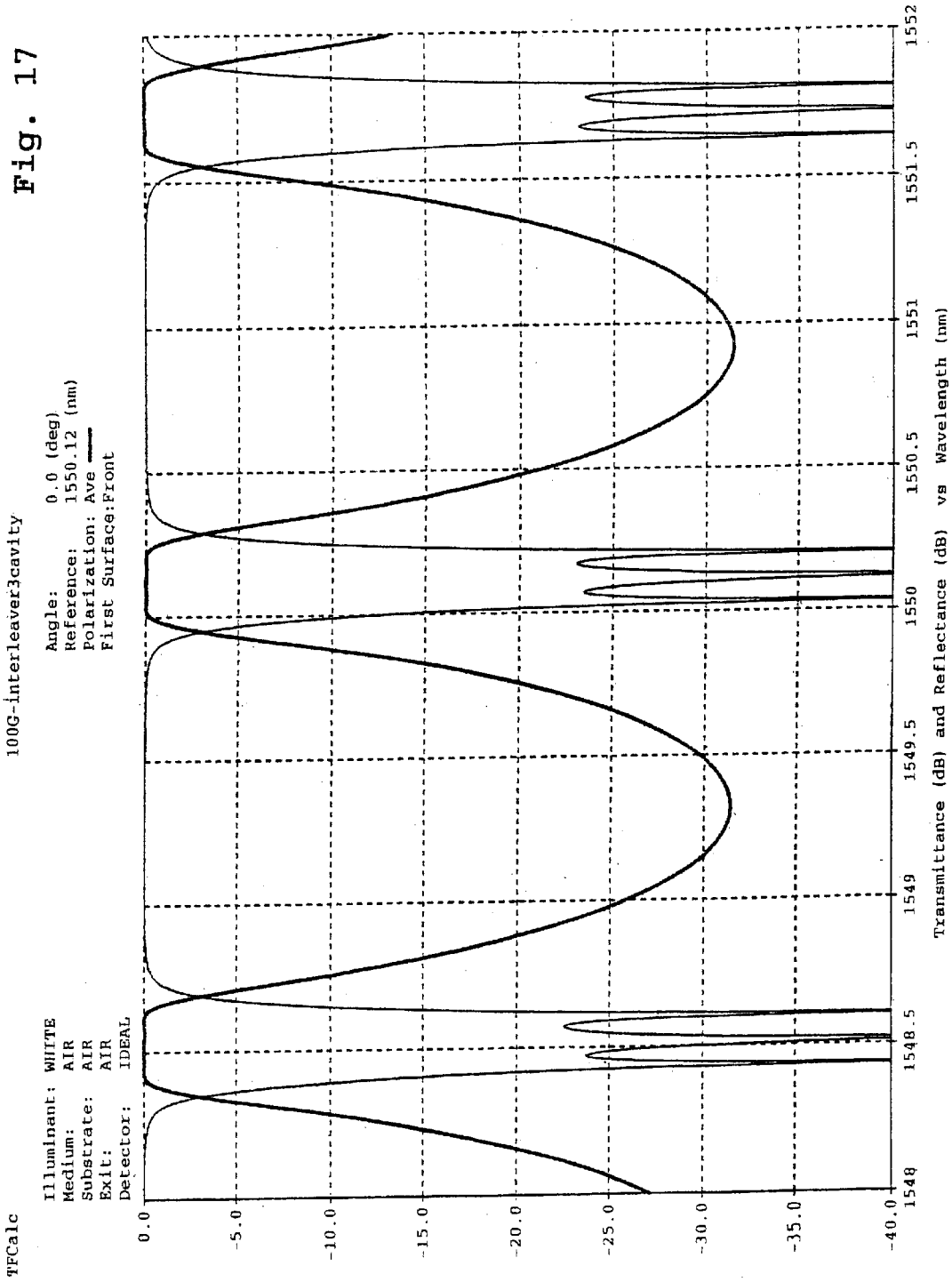
FIG. 17 is a graph showing than passband shape of a first embodiment of an optical system operative in a wavelength band.

The passband shape of the interleaver is shown in FIG. 17. As seen in Table I above and from the wave form shown in FIG. 17, the interleaver comprising stacked, directly optically coupled bulk-optic etalons produced in accordance with this example has good optical performance characteristics and is suitable for use, for example, in an optical telecommunication system.

Example 2

Optical System Comprising Three Interleavers Optically Coupled

Three 100 GHz interleavers prepared in accordance with Example 1 above are mounted in a common fitting, with the input port of the first interleaver arranged to receive multiplexed signals in any of channels 1 through n from a first optical fiber fed to the housing. The end of the optical fiber is fitted with a collimator to launch the multiplexed signal at the input port of the first interleaver at an angle of incidence not greater than 1 degree. The individual channels are assigned or pre-allocated a narrow passband straddling a center wavelength and are approximately 50 GHz channels. That is, the operating wavelength band of the system is divided into multiple (i.e., n) contiguous channels each allocated a passband within the 50 GHz allocated portion of the operative wavelength band. The first and second interleavers each has passbands coincident with the system channels, such that they pass every fourth and rejects all other channels of the multiplexed signal. The first interleaver has less than 50 GHz passbands and a 200 GHz period, such that it passes channels meeting the equation 1+4x, wherein x=0, 1, 2, . . . , and rejects the other 50 GHz channels of the multiplexed signal. The channels passed by the first interleaver may be referred to, for convenience, as the "first passed" channels and the reflected channels as the "first reflected" channels. It will be understood, however, that these labels are arbitrary. Thus, the first 50 GHz interleaver of the optical system is operative to pass a first semi-demultiplexed signal comprising the first passed channels of the multiplexed signal received from the first optical fiber. Such first semi-demultiplexed signal is passed to a first set of optical bandpass filters by a suitable signal carrier, such as an optical fiber fitted with collimators to carry the semi-demultiplexed signals passed by the first interleaver. A suitable signal carrier, such as an optical fiber fitted with collimators, to carry the semi-demultiplexed signals passed by the first interleaver, passes such first semi-demultiplexed signal to a first set of optical bandpass filters. Such semi-demultiplexed signal is thus further processed into individual channel signals. Typically, e.g., the semi-demultiplexed signal comprising the first passed channels can be further demultiplexed into individual channel signals using a set of 100 GHz passband filters. The 100 GHz individual passband filters are operative to isolate the individual 50 GHz "first passed" channels comprising the semi-demultiplexed signal passed by the first interleaver, because the 50 GHz "first reflected" channels that were adjacent each "first passed" channel have been removed from the signal. The second interleaver is similar to the first interleaver and is optically coupled to the first interleaver to receive the semi-demultiplexed signal rejected, i.e., reflected back, from the input port of the first interleaver. Specifically, a short optical fiber fitted with collimators or other suitable waveguide carries the semi-demultiplexed signals reflected from the input port of the first interleaver to the input port of the second interleaver. Thus, the second interleaver is downstream of the first interleaver (bearing in mind these systems and components may be operable in either or both directions), and the first interleaver is upstream of the second. The second interleaver is operative to receive the first reflected channels contained in the semi-demultiplexed signal reflected from (i.e., not passed by) the first interleaver. The second interleaver has less than 50 GHz passbands and a 200 GHz period, such that it passes channels meeting the equation $(1+4x)=1$, wherein $x=0, 1, 2, \ldots$, and rejects the other channels of the multiplexed signal. The channels passed by the second interleaver may be referred to, for convenience, as the "second passed" channels and the reflected channels as the "second reflected" channels. Thus, the second interleaver of the optical system is operative to pass a second semi-demultiplexed signal comprising the second passed channels of the multiplexed signal received from the second optical fiber. Such second semi-demultiplexed signal is passed to a second set of optical bandpass filters by a suitable signal carrier, such as an optical fiber fitted with collimators to carry the semi-demultiplexed signals passed by the second interleaver. Such semi-demultiplexed signal is thus further processed into individual channel signals. Typically, e.g., the semi-demultiplexed signal comprising the second passed channels can be further demultiplexed into individual channel signals using a set of 100 GHz passband filters. The 100 GHz individual passband filters are operative to isolate the individual 50 GHz "second passed" channels comprising the semi-demultiplexed signal passed by the second interleaver, because the 50 GHz "second reflected" channels that were adjacent each "second passed" channel have been removed from the signal. The second 50 GHz interleaver is optically coupled to the second interleaver to receive the semi-demultiplexed signal rejected, i.e., reflected back, from the input port of the second interleaver. Specifically, a short optical fiber fitted with collimators or other suitable waveguide carries the semi-demultiplexed signals reflected from the input port of the second interleaver to the input port of the second interleaver. Thus, the second interleaver is downstream of the second interleaver (bearing in mind these systems and components may be operable in either or both directions), and the second interleaver is upstream of the second. The second interleaver is operative to receive the second reflected channels contained in the semi-demultiplexed signal reflected from (i.e., not passed by) the second interleaver. The third interleaver, similar to the first and second interleavers, has less than 50 GHz passbands and a 200 GHz period, such that it passes channels meeting the equation $(1+4x)=1$, wherein $x=0, 1, 2, \ldots$, and rejects the other channels of the multiplexed signal. The channels passed by the third interleaver may be referred to, for convenience, as the "third passed" channels and the reflected channels as the "third reflected" channels. Thus, the third interleaver of the optical system is operative to pass a third semi-demultiplexed signal comprising the third passed channels of the multiplexed signal received from the third optical fiber. Such third semi-demultiplexed signal is passed to a third set of optical bandpass filters by a suitable signal carrier, such as an optical fiber fitted with collimators to carry the semi-demultiplexed signals passed by the third interleaver. Such semi-demultiplexed signal is thus further processed into individual channel signals. Typically, e.g., the semi-demultiplexed signal comprising the third passed channels can be further demultiplexed into individual channel signals using a set of 100 GHz passband filters. The 100 GHz individual passband filters are operative to isolate the individual "third passed" channels comprising the semi-demultiplexed signal passed by the third interleaver, because the "third reflected" channels that were adjacent each "third passed" channel have been removed from the signal. The third interleaver is optically coupled to the second interleaver to receive the semi-demultiplexed signal rejected, i.e., reflected back, from the input port of the second interleaver. Specifically, a short optical fiber fitted with collimators or other suitable waveguide carries the semi-demultiplexed signals reflected from the input port of the third interleaver to the input port of the third interleaver. Thus, the third interleaver is downstream of the second interleaver (bearing in mind these systems and components may be operable in either or both directions), and the second interleaver is upstream of the third. The third interleaver is operative to receive the third reflected channels contained in the semi-demultiplexed signal reflected from (i.e., not passed by) the second interleaver.

In this way, passband characteristics for the individual channels carried by the optical system are improved and individual channel passband filters designed for 100 GHz channels can be used in a more advanced optical system operating at 50 GHz channel spacings. Considerable cost savings can be achieved in this way in the design and installation of new optical systems. Also, existing installed individual channel passband filters and other such optical system components can continue to be used in a system being upgraded to denser channel spacing, thereby avoiding both the component and labor costs associated with installing new passband filters and related components.

Consistent with the foregoing disclosure, description of certain preferred embodiments and examples, it will understood by those skilled in the art that the channel spacing of typical interleavers disclosed here is set by the etalon free spectral range. That is, FSR=c/2nL, where c is the speed of light, n is the refractive index, and L is the etalon cavity thickness. For example, a 50 GHz interleaver can employ a fused silica cavity thickness of 1.02459 mm. Etalon cavity thickness also determines the resonance wavelength. Tight tolerances, preferably within $+/-10^{-6}$ should be met to center the transmission passbands accurately on the ITU grid. In addition, the individual etalons forming the stack should be matched in thickness to a tolerance of preferably +/−10⁻⁶ to achieve wide and flat pass and isolation bands suitable for certain demanding application such as telecommunication systems. Finally, coherent coupling of the stacked etalons typically imposes tight tolerances, preferably +/−10⁻⁶ on the thickness of the spacer layer between etalons. Although the present invention has been described above in terms of specific embodiments, it is anticipated that other uses, alterations and modifications thereof will become apparent to those skilled in the art given the benefit of this disclosure. It is intended that the following claims be read as covering such alterations and modifications as fall within the true spirit and scope of the invention.

What is claimed is:

1. An optical system operative in a wavelength band divided into multiple channels 1 through n, each channel having a substantially unique passband with a center wavelength spaced d nm from the center wavelength of adjacent channels within the band, comprising:
a first signal carrier capable of carrying multiplexed channels 1 through n; and
an interleaver having an input port optically coupled to the first signal carrier and operative to semi-demultiplex channels 1 through n, comprising a plurality of optically matched and directly optically coupled etalons and having periodic passbands of width less than d nm with a period equal to zd nm, where z is an integer value of at least 3 and wherein at least one etalon of the directly optically coupled etalons of the interleaver is a bulk optic etalon comprising first and second selectively transparent thin film mirror coatings on opposite first and second surfaces, respectively, of a bulk optic comprising a solid optically transparent body, the bulk optic defining the cavity spacing of the etalon.

2. The optical system of claim 1, further comprising a second signal carrier operative to receive a semi-demultiplexed signal reflected from the input port of the first interleaver and to pass a semi-demultiplexed signal to the input port of a second interleaver operative to semi-demultiplex channels 1 through n, and has periodic passbands of width less than d nm with a period equal to zd nm, where z is an integer value of at least 3, and the passbands of the second interleaver are different from the passbands of the first interleaver.

3. The optical system of claim 2, wherein the second interleaver comprises a plurality of optically matched and directly optically coupled etalons and having periodic passbands of width less than d nm with a period equal to zd nm, where z is an integer value of at least 3 and wherein at least one etalon of the directly optically coupled etalons of the interleaver in a bulk optic etalon comprising first and second selectively transparent thin film mirror coatings on opposite first and second surfaces, respectively, of a bulk optic comprising a solid optically transparent body, the bulk optic defining the cavity spacing of the etalon.

4. The operating system of claim 1, further comprising an array of passband filters optically coupled to an output port of the interleaver, each of the passband filters having a single passband less than d nm in the wavelength band substantially coincident with a passband of the interleaver.

5. The optical system of claim 1, further comprising a series of interleavers each operative to receive a semi-demultiplexed signal reflected from the input port of the interleaver preceding each interleaver in the series, each interleaver is operative to semi-demultiplex channels 1 through n, and have periodic passbands of width less than d nm with a period equal to zd nm, where z is an integer value of at least 3, and the passbands of each interleaver are different from the passbands of the other interleavers.

6. The optical system of claim 1, wherein the optically coupled etalons are in optical contact with each other.

7. The optical system of claim 1, wherein the optically transparent body comprises a monolithic glass body.

8. The optical system of claim 1, wherein the optically transparent body comprises a monolithic silica body.

9. The optical system of claim 1, wherein the bulk optic has a physical thickness of 0.5 to 2 mm.

10. The optical system of claim 1, wherein the bulk optic further comprises a wedge coating on a surface of the optically transparent body overlying the bulk optic and underlying the first thin film coating.

11. The optical system of claim 10, wherein the wedge coating and the optically transparent body have substantially the same index of refraction.

12. The optical system of claim 1, wherein the bulk optic further comprises a thickness-adjustment layer overlaying optically transparent body and underlying the first thin film coating.

13. The optical system of claim 12, wherein the thickness adjustment layer has a substantially uniform thickness greater than 0 and less than 100 microns.

14. The optical system of claim 12, wherein the thickness adjustment layer and the optically transparent body have substantially the same index of refraction.

15. The optical system of claim 1, wherein the first and second selectively transparent thin film coatings each comprises a continuous, uniform thickness metal film.

16. The optical system of claim 1, wherein the first and second selectively transparent thin film coatings each comprises a film stack of alternating higher and lower refractive index dielectric materials.

17. The optical system of claim 1, wherein each of the optically coupled etalons comprises first and second selectively transparent thin film mirror coatings on opposite surfaces of a bulk optic defining the cavity spacing of the etalons.

18. The optical system of claim 1, wherein each of the optically coupled etalons is spaced from an adjacent one of the optically coupled etalons a distance equal to an odd number of QWOTs.

19. The optical system of claim 1, further comprising a bonding layer attaching one etalon of the optically coupled etalons to an adjacent etalon.

20. The optical system of claim 19, wherein the bonding layer is in the optical path through the interleaver.

21. The optical system of claim 19, wherein the bonding layer is substantially out of the optical path through the interleaver.

22. The optical system of claim 19, wherein the bonding layer comprises fritted glass.

23. The optical system of claim 19, wherein the bonding layer comprises adhesive.

24. The optical system of claim 23, wherein the bonding layer further comprises spacer beads in the adhesive, a mono-layer of the spacer beads establishing the adhesive thickness between the first etalon and the adjacent etalon.

25. The optical system of claim 24, wherein the bonding layer comprises epoxy adhesive.

26. The optical system of claim 1, wherein the optically coupled etalons are stacked with a bonding layer attaching each of the optically coupled etalons to an adjacent one of the optically coupled etalons.

27. The optical system of claim 1, wherein one etalon of the optically coupled etalons is attached to, and spaced from, an adjacent etalon by stand-offs.

28. The optical system of claim 27, wherein the stand-offs are not in the optical path through the optically coupled etalons.

29. The optical system of claim 28, wherein the stand-offs are formed of fritted glass.

30. The optical system of claim 1, wherein the interleaver comprises at least one thin film etalon deposited on a surface of the bulk optic etalon.

31. The optical system of claim 1, wherein the signal carrier comprises optical fiber, an optical signal, waveguide, or air space.

32. The optical system of claim 1, wherein the wavelength band is the C band.

33. The optical system of claim 1, wherein the system further comprises multiple light sources, each a source of light signals in at least a corresponding one of the multiple channels 1 through n.

34. The optical system of claim 33, wherein the multiple light sources each comprises a laser.

35. The optical system of claim 33, wherein the system further comprises a means for multiplexing light from the multiple light sources.

36. The optical system of claim 1, wherein passbands of the interleaver within the wavelength band each has a center wavelength substantially aligned with the center wavelength of a corresponding one of the multiple channels 1 through n.

37. The optical system of claim 1, wherein passbands of the interleaver within the wavelength band each has a center wavelength not substantially aligned with the center wavelength of a corresponding one of the multiple channels.

38. The optical system of claim 1, wherein the input port of the interleaver is oriented to receive a multiplexed signal from the signal carrier an angle of incidence $\leq 1°$.

39. An optical system operative in a wavelength band divided into multiple channels 1 through n, each channel having a substantially unique passband with a center wavelength spaced d nm from the center wavelength of adjacent channels within the wavelength band, comprising:
   an interleaver having an input port optically coupled to a first signal carrier, operative to semi-demultiplexed channels 1 through n, comprising a plurality of optically matched and directly optically coupled etalons and having a periodic passband of less than width d nm and a period equal to zd nm, where z is an integer value of at least 3, wherein at least one of the directly optically coupled etalons of the interleaver comprises first and second selectively transparent thin film mirror coatings on opposite first and second surfaces, respectively, of a bulk optic comprising a solid optically transparent body, the bulk optic defining the cavity spacing of the etalon;
   a first signal carrier having a first port oriented to launch multiplexed signals from the first signal carrier to the input port of the interleaver;
   a second port optically coupled to the input port to receive a first semi-demultiplexed output signal reflected from the input port of the interleaver, comprising a first set of passbands corresponding to a first set of the multiple channels 1 through n, and optically coupled to a series of downstream interleavers each having an input port optically coupled to the input port of a preceding downstream interleaver in the series; and
   a third port optically coupled to an output port of the interleaver to receive a second semi-demultiplexed output signal passed by the interleaver, comprising a second set of passbands corresponding to a second set of the multiple channels 1 through n, wherein the first set of passbands are interleaved with the second set of passbands.

40. A method of making an optical system that is operative in a wavelength band divided into multiple channels 1 through n, each channel having a substantially unique passband within the wavelength band, comprising the steps of:
   providing an interleaver having a periodic passband of width less than d nm and a period equal to zd nm, where z is an integer value of at least 3, comprising a plurality of optically matched and directly optically coupled etalons, at least one of the etalons being a bulk optic etalon comprising first and second selectively transparent thin film mirror coatings on opposite first and second surfaces, respectively, of a bulk optic, the bulk optic defining the cavity spacing of the etalon, the interleaver being operative to semi-demultiplexed a multiplexed signal comprising passbands corresponding to channels 1 through n received at an input port of the interleaver;
   optically coupling the input port of the interleaver to a first signal carrier port of a first signal carrier operative to carry multiplexed signal corresponding to channels 1 through n, the first signal carrier port being aligned to launch multiplexed signals to the input port of the interleaver;
   optically coupling an output port of the interleaver to a second port operative to receive semi-demultiplexed signals passed by the interleaver; and
   optically coupling the input port of the interleaver to a third port operative to receive semi-demultiplexed signals reflected from the input port of the interleaver.

41. The method of claim 40, wherein at least one of the second and third ports is a receiving port of a sensor or detector.

42. A method of operating a telecommunication optical system in a wavelength band divided into multiple channels 1 through n having substantially equal passband width, each of the channels 1 through n having a substantially unique passband within the wavelength band with a center wavelength spaced d nm from the center wavelength of the passband of each adjacent channel within the wavelength band, the method comprising, in combination, the steps of:
   providing a series of interleavers each having an input port and an output port and each interleaver operative to pass a different subset of passbands within a wavelength range received via the input port, the subset of passbands of each of the interleavers being different from the subset of passbands of the other interleavers, and each interleaver optionally directly coupled to an interleaver, and wherein each interleaver comprising a plurality of optically matched and directly optically coupled etalons, at least one of the etalons being a bulk optic etalon comprising first and second selectively transparent thin film mirror coatings on opposite surfaces of a bulk optic defining the cavity spacing of the etalon, the width of the passbands of the interleaver being substantially equal to the passband width of the channels 1 through n and the period of the interleaver being zd nm, where z is an integer value of at least 3;
   optically coupling an input port of the interleaver to a first signal carrier port of a first signal carrier;
   optically coupling an output port of the interleaver to a second port operative to receive semi-demultiplexed signals passed by the interleaver;
   optically coupling the input port of the interleaver to a third port operative to receive semi-demultiplexed signals reflected from the input port of the interleaver;
   passing a multiplexed signal from the first signal carrier port to the input port of the interleaver;

receiving at the second port a semi-demultiplexed signal from the output port of the interleaver, comprising passbands corresponding to a first set of the multiple channels 1 through n; and receiving at the third port a semi-demultiplexed signal reflected from the input port of the interleaver, comprising passbands corresponding to a second set of the multiple channels 1 through n, wherein the first set of passbands meets the equation 1+xz, where z is an integer value of at least 3 and x is an integer value of at least 0, and the second set is all other passbands in the wavelength band.

43. An optical system operative in a wavelength band spanning a series of passbands each having a center wavelength spaced d nm from the center wavelength of adjacent passbands within the wavelength band, comprising:

a series of interleavers, each having an input port operative to receive optical signals in the wavelength band and an output port operative to pass semi-demultiplexed optical signals received via the input port and optically coupled to signal carriers and each interleaver comprising a plurality of optically matched and directly optically coupled etalons, having periodic passbands of less than width d nm and a period equal to zd nm, where z is an integer value of at least 3, wherein at least one of the optically coupled etalons of the interleaver is a bulk optic etalon and comprises first and second selectively transparent thin film mirror coatings on opposite first and second surfaces, respectively, of a bulk optic comprising a solid, optically transparent body, the dimension of the light path through the bulk optic defining the cavity spacing of the etalon.

44. The optical system of claim 43, further comprising a set of passband filters optically coupled to the interleaver to receive at least a portion of the first semi-demultiplexed signal from an output port of the interleaver, each of the passband filters having a passband substantially coincident with a different one of the series of passbands 1 through n of the wavelength band.

45. The optical system of claim 44, wherein the passband filters optically coupled to the interleaver are mounted in a common fitting with the interleaver.

* * * * *